(12) United States Patent
Park et al.

(10) Patent No.: US 9,406,359 B2
(45) Date of Patent: Aug. 2, 2016

(54) MEMORY DEVICES, MEMORY SYSTEMS, AND RELATED OPERATING METHODS

(71) Applicants: Hyun-Kook Park, Anyang-si (KR); Yeong-Taek Lee, Seoul (KR); Dae-Seok Byeon, Seongnam-si (KR); Chi-Weon Yoon, Seoul (KR)

(72) Inventors: Hyun-Kook Park, Anyang-si (KR); Yeong-Taek Lee, Seoul (KR); Dae-Seok Byeon, Seongnam-si (KR); Chi-Weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/683,186

(22) Filed: Apr. 10, 2015

(65) Prior Publication Data
US 2016/0027485 A1    Jan. 28, 2016

(30) Foreign Application Priority Data
Jul. 28, 2014  (KR) .................. 10-2014-0096016

(51) Int. Cl.
| | |
|---|---|
| *G11C 29/52* | (2006.01) |
| *G11C 7/22* | (2006.01) |
| *G06F 11/07* | (2006.01) |
| *G11C 7/06* | (2006.01) |
| *G11C 7/10* | (2006.01) |
| *G11C 7/14* | (2006.01) |
| *G11C 11/56* | (2006.01) |
| *G11C 13/00* | (2006.01) |
| *G11C 29/02* | (2006.01) |
| *G11C 29/42* | (2006.01) |
| *G11C 7/12* | (2006.01) |

(52) U.S. Cl.
CPC ............. *G11C 7/22* (2013.01); *G06F 11/073* (2013.01); *G06F 11/076* (2013.01); *G11C 7/062* (2013.01); *G11C 7/067* (2013.01); *G11C 7/1045* (2013.01); *G11C 7/14* (2013.01); *G11C 11/5642* (2013.01); *G11C 13/004* (2013.01); *G11C 29/021* (2013.01); *G11C 29/026* (2013.01); *G11C 29/028* (2013.01); *G11C 29/42* (2013.01); *G11C 29/52* (2013.01); *G11C 7/12* (2013.01); *G11C 2013/0054* (2013.01)

(58) Field of Classification Search
CPC ....... G06F 11/073; G06F 11/076; G11C 7/22; G11C 29/42; G11C 29/52; G11C 29/021; G11C 29/026; G11C 29/028; G11C 11/5642; G11C 7/14; G11C 7/062; G11C 7/1045; G11C 7/067; G11C 13/004; G11C 2013/0054; G11C 7/12
See application file for complete search history.

(56) References Cited

U.S. PATENT DOCUMENTS

| | | | |
|---|---|---|---|
| 7,865,797 B2 | 1/2011 | Eguchi et al. | |
| 8,154,921 B2 | 4/2012 | Mokhlesi et al. | |
| 8,189,386 B2 | 5/2012 | Park et al. | |
| 8,400,814 B2 | 3/2013 | Tokiwa | |
| 8,422,291 B2 | 4/2013 | Kim et al. | |
| 8,479,083 B2 | 7/2013 | Chae et al. | |
| 2007/0036014 A1* | 2/2007 | Bolandrina | G11C 11/5642 365/210.12 |

(Continued)

FOREIGN PATENT DOCUMENTS

JP        07282537       10/1995

*Primary Examiner* — Khamdan Alrobaie
(74) *Attorney, Agent, or Firm* — Volentine & Whitt, PLLC

(57) ABSTRACT

A method of operating a memory system including memory cells commonly connected to a first signal line in a memory cell array includes; dividing the memory cells according to cell regions, and independently performing read operations on memory cells disposed in each cell region using a read reference selected from a plurality of read references and respectively corresponding to each cell region.

17 Claims, 29 Drawing Sheets

(56) References Cited

U.S. PATENT DOCUMENTS

| | | | |
|---|---|---|---|
| 2008/0239851 A1* | 10/2008 | Lin | G11C 16/3418 365/222 |
| 2008/0285351 A1* | 11/2008 | Shlick | G11C 11/5621 365/185.18 |
| 2012/0057409 A1* | 3/2012 | Lee | G11C 7/1048 365/185.25 |
| 2012/0268994 A1 | 10/2012 | Nagashima | |
| 2012/0314478 A1 | 12/2012 | Ha et al. | |
| 2013/0139036 A1 | 5/2013 | Lee | |
| 2013/0148435 A1 | 6/2013 | Matsunaga | |
| 2013/0159785 A1 | 6/2013 | Hashimoto | |
| 2013/0194883 A1 | 8/2013 | Lee | |
| 2013/0258778 A1 | 10/2013 | Oh | |
| 2014/0029355 A1 | 1/2014 | Choi et al. | |
| 2014/0043903 A1* | 2/2014 | Ok | G11C 16/26 365/185.03 |
| 2014/0075241 A1 | 3/2014 | Oh et al. | |
| 2014/0082459 A1 | 3/2014 | Li et al. | |
| 2016/0035417 A1* | 2/2016 | Park | G11C 13/0033 365/148 |

\* cited by examiner

MEMORY DEVICES, MEMORY SYSTEMS, AND RELATED OPERATING METHODS

CROSS-REFERENCE TO RELATED APPLICATION

This application claims the benefit of Korean Patent Application No. 10-2014-0096016, filed on Jul. 28, 2014, in the Korean Intellectual Property Office, the subject matter of which is hereby incorporated by reference.

BACKGROUND

The inventive concept relates generally to memory devices, memory systems and methods of operating same. More particularly, the inventive concept relates to memory devices performing read retry operations, memory systems performing a read retry operations, and methods of operating same.

According to a demand for a high capacity and low power consumption of a memory device, a research for next-generation memory devices is being conducted. The next-generation memory devices are required to have a high integrity characteristic of a dynamic random access memory (DRAM), a non-volatile characteristic of a flash memory, and a high speed of a static RAM (SRAM). As the next-generation memory devices, a phase change RAM (PRAM), a nano floating gate memory (NFGM), a polymer RAM (PoRAM), a magnetic RAM (MRAM), a ferroelectric RAM (FeRAM), and a resistive RAM (RRAM) are being highlighted.

SUMMARY

According to an aspect of the inventive concept, there is provided a method of operating a memory system including memory cells commonly connected to a first signal line in a memory cell array. The method includes; dividing the memory cells according to cell regions, and independently performing read operations on memory cells disposed in each cell region using a read reference selected from a plurality of read references and respectively corresponding to each cell region.

According to an aspect of the inventive concept, there is provided a method of operating a memory system comprising a memory device including a plurality of memory cells disposed in a plurality of cell regions disposed in areas where first signal lines and second signal lines respectively cross in a memory cell array, and a memory controller. The method includes; communicating a normal read command from the memory controller to the memory device directed to target memory cells selected from the plurality of memory cells, executing a normal read operation with respect to the target memory cells and storing normal read result data in a page buffer connected to the second signal lines, determining different read references respectively corresponding to each one of the plurality of cell regions, and if a number of errors in the normal read result exceeds a critical value, communicating a read retry command together with information defining the different read references to the memory device and performing a read retry operation on the target memory cells.

According to an aspect of the inventive concept, there is provided a memory device including; a memory cell array including a plurality of memory cells disposed in areas where a plurality of first signal lines and a plurality of second signal lines cross each other, a write/read circuit configured to perform a write operation and a read operation on memory cells selected from the plurality of memory cells and including a page buffer that temporarily stores read data, and control logic configured to control a read operation on the selected memory cells by using a plurality of different read references respectively corresponding to a plurality of cell regions divided from the selected memory cells in a read retry section.

BRIEF DESCRIPTION OF THE DRAWINGS

Embodiments of the inventive concept will be described in conjunction with the accompanying drawings in which.

DETAILED DESCRIPTION

Certain embodiments of the inventive concept will now be described in some additional detail with reference to the accompanying drawings. The inventive concept may, however, be embodied in many different forms, and should not be construed as being limited to only the illustrated embodiments. Rather, these embodiments are provided so that this disclosure will be thorough and complete, and will fully convey the concept of the inventive concept to those skilled in the art. The scope of the inventive concept includes many revisions, equivalents, or substitutions to the particular elements, method steps and features specially described herein. Throughout the written description and drawings, like reference numbers and labels denote like or similar elements and features.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless defined otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly defined otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

Figure 1:
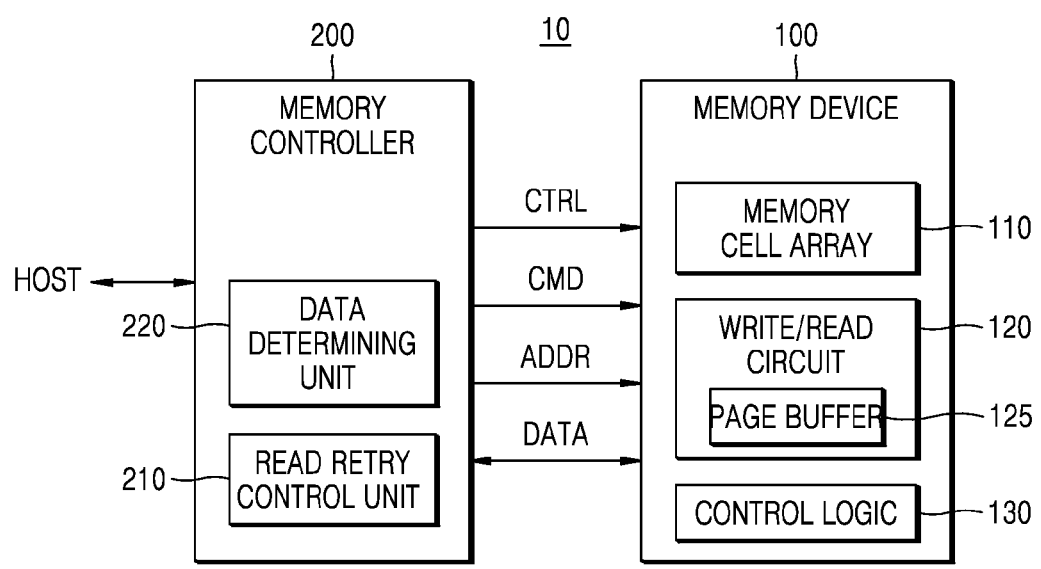
FIG. 1 is a block diagram of a memory system according to an embodiment of the inventive concept.

FIG. 1 is a block diagram of a memory system 10 according to an embodiment of the inventive concept.

Referring to FIG. 1, the memory system 10 comprises a memory device 100 and a memory controller 200. The memory device 100 includes a memory cell array 110, a write/read circuit 120, and a control logic 130, and the memory controller 200 includes a read retry control unit 210 and a data determining unit 220.

In response to a write/read request from a host, the memory controller 200 may control the memory device 100 such that data stored in the memory device 100 is read or data is written to the memory device 100. In detail, the memory controller 200 may provide the memory device 100 with an address ADDR, a command CMD, and a control signal CTRL and thus may control a programming (or write) operation, a read operation, and an erase operation on the memory device 100. Also, data DATA for a programming operation and read data DATA may be transmitted or received between the memory controller 200 and the memory device 100.

The memory controller 200 may include the read retry control unit 210 and the data determining unit 220. The memory controller 200 may perform an error detection and correction operation with respect to data provided by the memory device 100, and may further include an error correction code (ECC) unit (not shown) to perform error detection and correction. The memory controller 200 will be described in detail later with reference to FIG. 7.

The memory cell array 110 may include a plurality of memory cells (not shown) that are disposed respectively in regions where a plurality of first signal lines and a plurality of second signal lines cross. According to an embodiment, the first signal lines may be word lines, and the second signal lines may be bit lines. According to another embodiment, the first signal lines may be bit lines, and the second signal lines may be word lines. The memory device 100 including the memory cell array 110 as described above may be referred to as a cross point memory device.

Memory cells selected from the plurality of memory cells and commonly connected to a first signal line may be divided into a plurality of cell regions. That is, the selected memory cells may be divided into a plurality of cell regions based on relative position within the memory cell array. For example, selected memory cells may be divided into a plurality of cell regions according to physical address(es), or logical address(es). Selected memory cells may be divided into a plurality of cell regions according to defined ECC units, where the size of each cell region may be defined as 'n' times a given ECC unit (or ECC chunk). According to various embodiments of the inventive concept, such "cell regions" may alternately be referred to as "groups", "sectors", "regions", "zones" and/or "sections".

According to various embodiments of the inventive concept, the plurality of memory cells may include resistance-type memory cells or resistive memory cells that include a variable resistor device (not shown) having a variable resistance. For one example, when resistance of the variable resistor device that is formed of a phase change material (e.g., Ge—Sb—Te) is changed according to a temperature, a resistive memory device may be a phase change RAM (PRAM). For another example, when the variable resistor device is formed of an upper electrode, a lower electrode, and a transition metal oxide (complex metal oxide) there between, the memory device 100 may be a resistive RAM (ReRAM). For another example, when the variable resistor device is formed of an upper electrode of a magnetic material, a lower electrode of a magnetic material, and a dielectric there between, the memory device 100 may be a magnetic RAM (MRAM). However, embodiments of the inventive concept are not limited thereto, and according to another embodiment, the plurality of memory cells may not be resistive memory cells.

The write/read circuit 120 may be used to perform write and/or read operations (hereafter, singularly or collectively, "read/write operations") on memory cells selected from among the plurality of memory cells. The read/write circuit 120 may include one or more page buffer(s) 125. When a write operation is executed in relation to selected memory cells, the page buffer 125 will be used as a write buffer to temporarily store "write data" to be written to the memory device 100. However, when a read operation is executed in relation to selected memory cells, the page buffer 125 may be used as a read buffer to temporarily store the retrieved read data. The size of the page buffer 125 may be N bits (e.g., 8 KB), and the size of each cell region may be M bits, where M is smaller than N.

The control logic 130 may generally be used to control the overall operation of the memory device 100. For example, the control logic 130 may be used to control the operation of the write/read circuit 120 during various operations, such as write/read operations. That is, in order to perform a write/read operations on the memory device 100, the control logic 130 may provide the write/read circuit 120 with various pulse signals such as a write pulse or a read pulse, and the write/read circuit 120 may provide the memory cell array 110 with a write current (or a write voltage) or a read current (or a read voltage) based on the various pulse signals.

If correction of error(s) detected with respect to certain read data retrieved from the memory device 100 proves impossible, the memory controller 200 may control the memory device 100 to execute a so-called "read retry operation". For example, a read retry operation may include reading (or re-reading) data in relation to one or more modified control voltages (or references—e.g., a read reference) used to determine binary data values of "0" and "1" for a single-level memory cell (SLC). The modification of the references may be accomplished by analyzing a statistical "valley" associated with a resistance level distribution for the SLC by performing a data determining operation with respect to read data, and then performing a restoration algorithm, whereby an appropriate reference is obtained that minimizes generation of errors in the read data.

In the embodiment illustrated in FIG. 1, the read retry control unit 210 may be used to determine whether or not to perform a read retry operation in view of a number of detected read errors and an established critical value, and may further be used to determine an appropriate read reference for the read retry operation. Thus, the read retry control unit 210 may determine different read references, respectively corresponding to memory cell groups included in the memory cell array 110. And the read retry control unit 210 may be used to communicate a read retry command along with the different read references to the memory device 100. For example, the different read references may be communicated from the memory controller 200 to the memory device 100 in the form of one or more control signal(s) CTRL.

In this regard, the read retry control unit 210 may provide the memory device 100 with "read information" related to various read references needed to search a resistance level distribution for resistive memory cells, and the memory device 100 may perform a read operation by setting read condition(s) based on the received read information. Then, the read data may be provided to the memory controller 200, where the data determining unit 220 is used to perform a data determining operation in order to generate a "read determination result".

In the context of the foregoing, read condition(s) may be differently defined for a "normal read operation" (i.e., a read operation used under an assumed set of nominal or normal operating conditions) and a read retry operation (i.e., a read operation used when a normal read operation yields read data with an excessive number of errors). Thus, "normal read operations conditions" may be distinct from "read retry conditions"—including associated references.

With reference to the illustrated embodiment of FIG. 1, a normal read operation may be executed in relation to selected memory cells of the memory cell array 110 according to a single ("normal") read reference, regardless of the specific disposition of the selected memory cells among the plurality of memory cells in the memory cell array 110. For example, the control logic 130 may control the execution of a normal read operation directed to memory cells in the memory cell array 110 that are commonly selected according to a first signal line using the single read reference. Alternately, the control logic 130 may control execution of a read retry operation directed to a group of memory cells commonly connected to a first signal line (e.g., a word line) in the memory cell array 110 using different read references corresponding to different cell regions divided from the selected memory cells. Thus, memory cells selected by their common connection to a signal line may be divided into designated cell regions, and then each cell region may be read during a read retry operation using a corresponding read reference that may be different from other read references used to read other cell regions. In this regard, the control logic 130 may receive read information defining different read references, respectively used to read (during a read retry operation) a corresponding cell region.

According to certain embodiments of the inventive concept, a first set of read references associated with reading memory cells connected to a first signal line may be different, wholly or in part, a second set of read references associated with reading memory cells connected to a second signal line. In this regard, multiple write/read circuits 120 (and/or multiple page buffers 125) may be used to read selected memory cells arranged in different cell regions using different read references.

Thus, data may be read under differently defined read retry conditions, respectively associated with different cell regions, during a read retry operation, where all data so read may be stored in the page buffer 125. For example, if a first cell region of a selected page includes first memory cells storing first read data, and a second cell region of the selected page includes second memory cells storing second read data page, the first and second data may be respectively read under different, first and second read retry conditions. Here, the first read data and second read data may be provided to the data determining unit 220, and the data determining unit 220 may be used to make independent determinations with respect to the first read data and second read data in order to analyze respective resistive data valleys associated with a given resistance level distribution.

The read retry control unit 210 may control subsequent read retry operation(s) based on a determination result generated by the data determining unit 220. For example, if first and second read references are used during a read retry operation, whereby error generation is minimized for first and second read data respectively, read information related to the use of first and second read references may be provided to the memory device 100.

The designation of cell regions from a larger group of memory cells in various embodiments of the inventive concept may be performed in relation to relative location of memory cells in each cell region within the memory cell array. For example, cell region designation may be done according location along a particular signal line commonly connecting (or providing a common access control signal path) the memory cells of a cell region. Hence read retry operations may be independently performed on the cell regions using different read references for each respective cell region. Furthermore, a plurality of valleys for resistance level distributions may be searched for (or predicted) with respect to the cell regions. Accordingly, local variations related to relative location of the memory cells in a particular cell region of the memory cell array 110 may be compensated.

The memory controller 200 and the memory device 100 may be integrated to a semiconductor device. For example, the memory controller 200 and the memory device 100 may be integrated to the semiconductor device and thus may configure a memory card. For one example, the memory controller 200 and the memory device 100 may be integrated to the semiconductor device and thus may configure a PC card (a PCMCIA card), a compact flash card (CF card), a smart media card (SM/SMC), a memory stick, a multimedia card (MMC, RS-MMC, or MMCmicro, an SD card (SD, miniSD, or microSD), or a universal flash storage (UFS). For another example, the memory controller 200 and the memory device 100 may be integrated to the semiconductor device and thus may configure a Solid State Disk/Drive (SSD).

Figure 2:
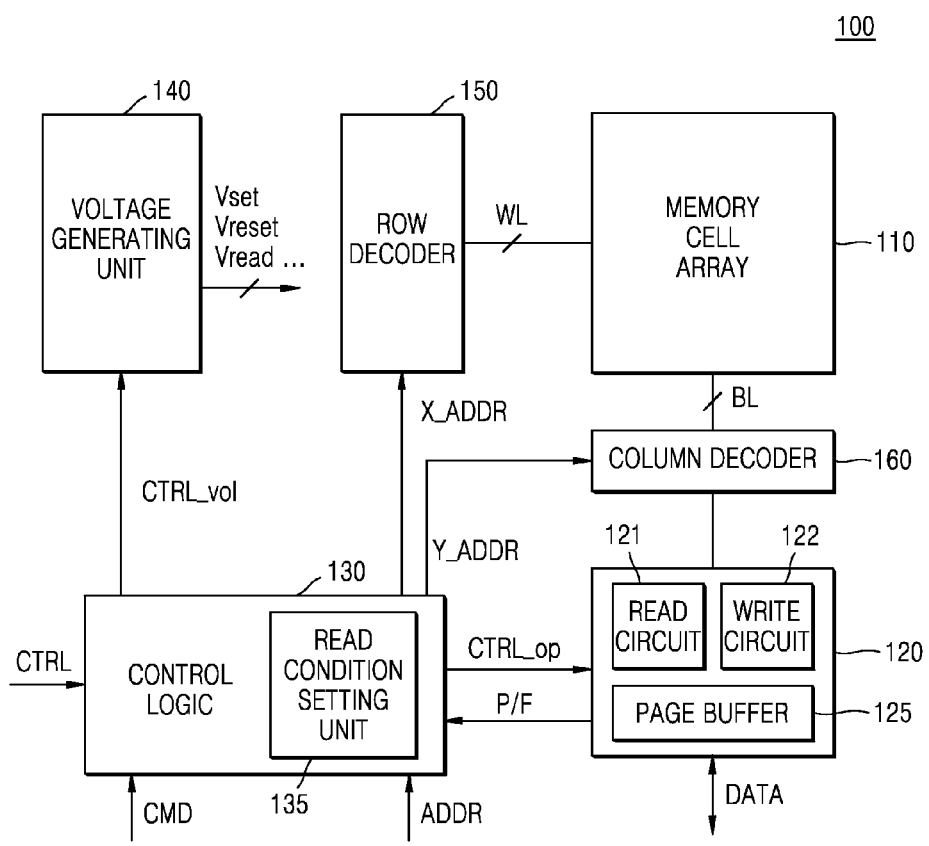
FIG. 2 is a block diagram further illustrating in one example the memory device 100 of FIG. 1.

FIG. 2 is a block diagram further illustrating in one example the memory device 100 in the memory system 10 of FIG. 1.

Referring to FIG. 2, the memory device 100 comprises; the memory cell array 110, the write/read circuit 120, the control logic 130, a voltage generating unit 140, a row decoder 150, and a column decoder 160. The write/read circuit 120 shown in FIG. 2 includes a read circuit 121, a write circuit 122, and a page buffer 125.

As noted above, the memory cells of the memory cell array 110 are respectively connected in relation to first signal lines and second signal lines (e.g., at respective crossing points for the first and second signal lines). Hereinafter, the illustrated embodiments assume that the first signal lines are bitlines BL and the second signal lines are wordlines WL.

Figure 3:
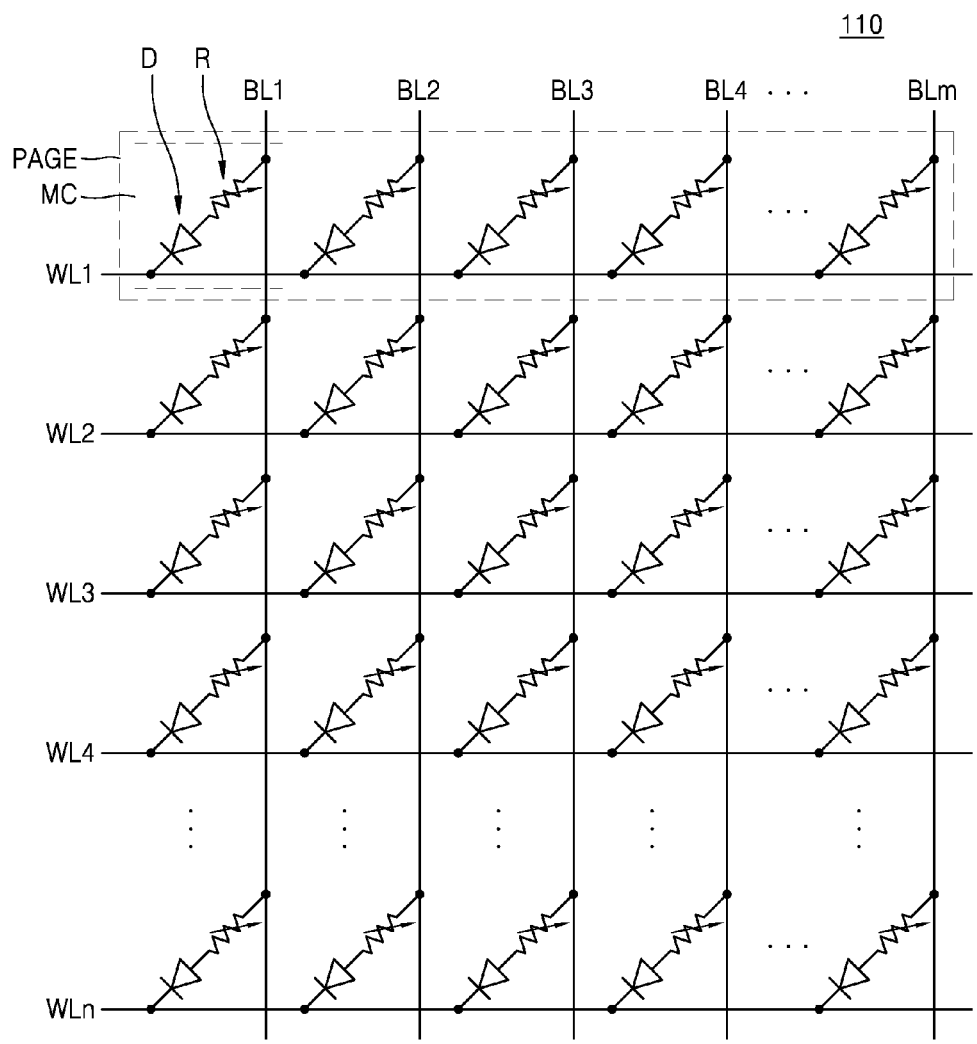
FIG. 3 is a circuit diagram further illustrating in one example the memory cell array 110 of FIG. 2.

FIG. 3 is a circuit diagram further illustrating in one example the memory cells of the memory cell 110 array of FIG. 2.

Referring to FIG. 3, the memory cell array 110 is a two-dimensional (or horizontal) memory structure including word lines WL1 through WLn, bit lines BL1 through BLm, and a plurality of memory cells MC. The number of word lines WL, bit lines BL, and memory cells MC will vary according to embodiment. Further, in other embodiments of the inventive memory cell array 110 will be a three-dimensional (or vertical) memory structure.

In the example illustrated in FIG. 3, each of the plurality of memory cells MC may include a variable resistor device R and a selection device D. The variable resistor device R may be referred to as a variable resistance material, and the selection device D may be referred to as a switching device.

The variable resistor device R is connected between one of a plurality of bit lines BL1 through BLm and the selection device D, and the selection device D may be connected between the variable resistor device R and one of a plurality of word lines WL1 through WLn. However, the embodiments of the inventive concept are not limited thereto, and the selection device D may be connected between one of a plurality of bit lines BL1 through BLm and the variable resistor device R, and the variable resistor device R may be connected between the selection device D and one of a plurality of word lines WL1 through WLn.

The selection device D may be connected between one of the plurality of word lines WL1 through WLn and the variable resistor device R, and may control a current supply to the variable resistor device R according to a voltage applied to the connected word line and bit line. While a diode is illustrated as the selection device D in FIG. 3, this is merely an exemplary embodiment of the inventive concept, and according to another embodiment, the selection device D may be modified to other switchable device.

Figure 4:
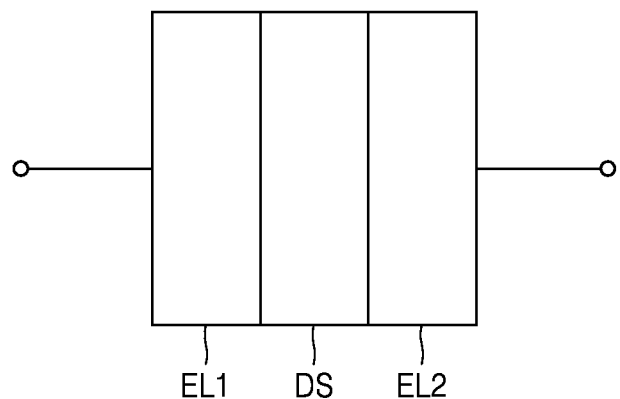
FIG. 4 is a diagram illustrating one example of a variable resistor device that may be included in the memory cells MC of FIG. 3.

FIG. 4 is a diagram illustrating in one example the variable resistor device R included in the memory cell MC of FIG. 3.

Referring to FIG. 4, the variable resistor device R includes first and second electrodes EL1 and EL2 and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminum (Al), copper (Cu), a titanium nitride (TiN), a titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN)), nickel (Ni), cobalt (Co), chromium (Cr), antimony (Sb), iron (Fe), molybdenum (Mo), palladium (Pd). Tin (Sn). Zirconium (Zr), zinc (Zn), iridium oxide ($IrO_2$), strontium zirconate ($StZrO_3$), or the like.

The data storage film DS may be formed of a bipolar resistance memory material or a unipolar resistance memory material. The bipolar resistance memory material may be programmed in a set or reset state via a polarity of a pulse, and Perovskite-based material may be used as the bipolar resistance memory material. Meanwhile, a unipolar resistance memory material may be programmed in a set or reset state via a pulse of the same polarity, and transition metal oxides such as NiOx or TiOx may be used as the unipolar resistance memory material.

FIGS. 5A, 5B, 5C and 5D are respective circuit diagrams illustrating various examples of the memory cell MC shown in FIG. 4.

Figure 5A:
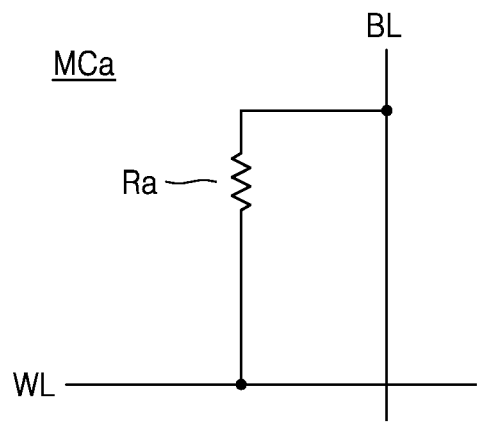
FIGS. 5A, 5B, 5C and 5D are respective circuit diagrams illustrating examples of the memory cells of FIG. 4.

Referring to FIG. 5A, a memory cell MCa may include a variable resistor device Ra that may be connected between a bitline BL and a wordline WL. The memory cell MCa may store data due to voltages that are applied to the bitline BL and the wordline WL, respectively.

Figure 5B:
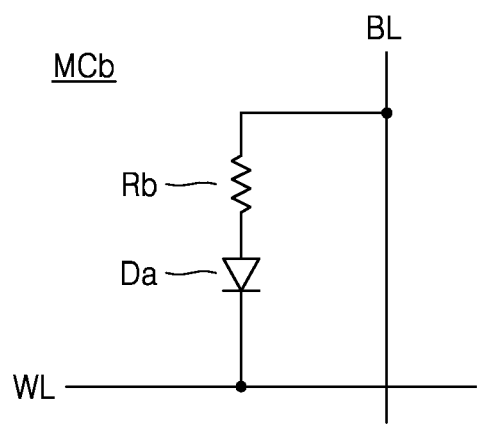

Referring to FIG. 5B, a memory cell MCb may include a variable resistor device Rb and a unidirectional diode Da. The variable resistor device Rb may include a resistive material so as to store data. The unidirectional diode Da may be a selection device that supplies or blocks a current to the variable resistor device R according to a bias of the word line WL and the bit line BL, that is, a switching device. The unidirectional diode Da may be connected between the variable resistor device Rb and the wordline WL, and the variable resistor device Rb may be connected between the bitline BL and the unidirectional diode Db. Positions of the unidirectional diode Db and the variable resistor device Rb may be changed with respect to each other.

According to an embodiment, the unidirectional diode Da may be a PN junction diode or a PIN junction diode, and an anode of the unidirectional diode Da may be connected to the variable resistor device Rb, and a cathode of the unidirectional diode Da may be connected to one of a plurality of word lines WL1 through WLn. If a voltage difference between the anode and the cathode of the unidirectional diode Da is greater than a threshold voltage of the unidirectional diode Da, the unidirectional diode Da is turned on to supply a current to the variable resistor device Ra.

Figure 5C:
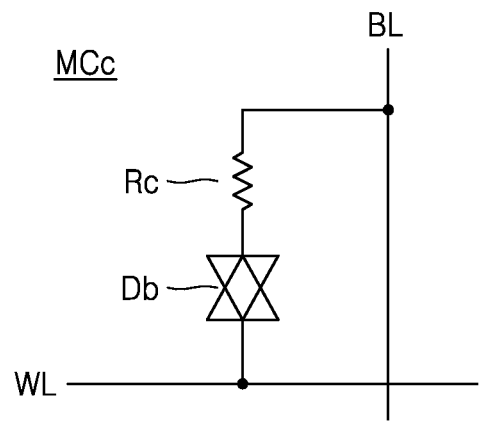

Referring to FIG. 5C, a memory cell MCc may include a variable resistor device Rc and a bidirectional diode Db. The variable resistor device Rc may include a resistive material so as to store data. The bidirectional diode Db may be connected between the variable resistor device R and a wordline WL, and the variable resistor device Rc may be connected between a bitline BL and the bidirectional diode Db. Positions of the bidirectional diode Db and the variable resistor device Rc may be changed with respect to each other. By using the bidirectional diode Db, a leakage current that may flow to a non-selected resistor cell may be cut.

Figure 5D:
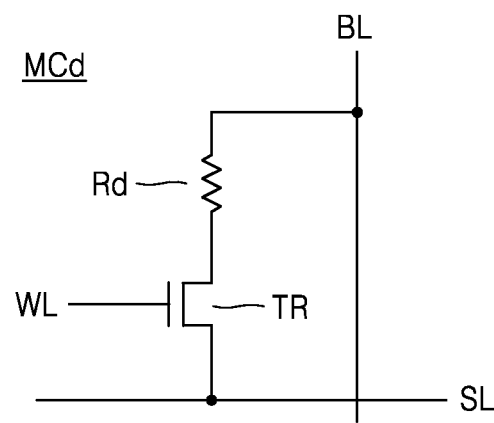

Referring to FIG. 5D, a memory cell MCd may include a variable resistor device Rd and a transistor TR. The transistor TR may be a selection device that supplies or blocks a current to the variable resistor device Rd according to a voltage of the word line WL, that is, a switching device. The transistor TR may be connected between the variable resistor device Rd and the wordline WL, and the variable resistor device R may be connected between a bitline BL and the transistor TR. Positions of the transistor TR and the variable resistor device Rd may be changed with respect to each other. The memory cell MCd may be selected or not selected, according to ON or OFF of the transistor TR that is driven by the wordline WL.

Referring to FIG. 2, the read circuit 121 may be connected to a selected bit line BL to read data DATA stored in the selected memory cell MC, and accordingly, the data DATA stored in the memory cell array 110 may be output. The read circuit 121 may perform a normal read operation on a selected memory cell MC if a normal read command is received from the memory controller 200, and if a read retry command is received from the memory controller 200, the read circuit 121 may perform a read retry operation according to a read retry with respect to a selected memory cell MC.

In the context of the foregoing examples, if a read retry operation is performed on selected memory cells of the memory cell array 110, the read circuit 121 may independently perform cell-region-specific read retry operations for each one of a number of designated cell regions divided from the selected memory cells, where the resulting plurality of cell-region-specific read retry operations are executed using different read conditions (i.e., different read references). Data read for each of the cell regions may then be simultaneously or sequentially stored in the page buffer 125.

Also, before executing a write operation directed to selected memory cells of the memory cell array 110, the read circuit 121 may perform a "pre-read retry operation", whereby an initial resistance state for the selected memory cells is read in advance by performing a normal read operation on the selected memory cells. Furthermore, after performing a write operation on the selected memory cells, the read circuit 121 may perform a "verify read operation", whereby the written data state of the selected memory cells is determined.

The read circuit 121 may provide read data from a normal read operation or a read retry operation, to one or more circuits external to the memory device 100 (e.g., the memory controller 200). Also, as the result of an executed pre-read retry operation or verify read operation, the read circuit 121 may provide the read data (DATA) as a pass/fail signal P/F indicating the success/failure of a preceding write operation to circuits internal to the memory device 100 (e.g., the control logic 130 or write circuit 122).

The write circuit 122 is connected to a selected bit line BL so as to provide a selected memory cell with a pulse to thereby perform a write (or program) operation and provide the data to be stored in the memory cell array 110, accordingly. The term "pulse" as used here may be referred to a programming pulse or a write pulse, and may be a current pulse or a voltage pulse.

The write circuit 122 may be used to execute a write operation in a set direction in which a selected memory cell is programmed in a direction in which the resistance of the selected memory cell decreases (e.g., a "set write operation").

Also, the write circuit 122 may perform a write operation directed to a selected memory cell in a reset direction in which resistance of the selected memory cell MC is increased (e.g., a "reset write operation").

In FIG. 2, the write/read circuit 120 is connected to the column decoder 160 and accordingly to the bit line(s) BL. However, the embodiments of the inventive concept are not limited thereto, and the write/read circuit 120 might alternately be connected to the row decoder 150 and accordingly to the word line(s) WL.

The control logic 130 may be used to provide various control signals to write data to the memory cell array 110 or read data from the memory cell array 110 based on a command CMD, an address ADDR, and a control signal CTRL received from the memory controller 200. Various control signals output from the control logic 130 may be provided to the write/read circuit 120, the voltage generating unit 140, the row decoder 150, and the column decoder 160, and accordingly, the control logic 130 may control various operations in the memory device 100 overall.

For example, the control logic 130 may generate operational control signals CTRL_op based on a command CMD and a control signal CTRL, and may provide the operational control signals CTRL_op to the write/read circuit 120. The operational control signals CTRL_op may include a write enable signal WEN, a read enable signal REN, a sense enable signal SEN, a discharge signal DIS, and a precharge enable signal PRE, which will be described in detail later with reference to FIGS. 14 and 15.

Also, the control logic 130 may generate a voltage control signal CTRL_vol based on a command CMD, a control signal CTRL, and a pass/fail signal P/F received from the read circuit 121. The control logic 130 may provide the voltage generating unit 140 with the generated voltage control signal CTRL_vol. The voltage control signal CTRL_vol is a signal used to adjust levels of voltages provided to the voltage generating unit 140.

Furthermore, the control logic 130 may divide a row address X_ADDR and a column address Y_ADDR from an address ADDR and provide the row decoder 150 with a row address X_ADDR, and provide the column decoder 160 with a column address Y_ADDR.

With respect to the illustrated embodiment of FIG. 2, the control logic 130 may define a read condition according to a read reference received from the memory device 100, and may provide the write/read circuit 120 and voltage generating unit 140 with control signals according to the defined read condition. That is, the control logic 130 may define a normal read condition according to a normal read reference, and provide the write/read circuit 120 and voltage generating unit 140 with control signals according to the normal read condition. Also, the control logic 130 may define a number of read retry conditions for a corresponding number of read retry operation according to a plurality of read retry references, and may provide write/read circuit 120 and voltage generating unit 140 with a control signal according to the defined plurality of read retry conditions.

The voltage generating unit 140 may be used to generate various types of voltages used to perform a write, read, and erase operations on the memory cell array 110 based on a voltage control signal CTRL_vol. For example, the voltage generating unit 140 may generate a reset write voltage Vreset, a set write voltage Vset, and a read voltage Vread. Also, the voltage generating unit 140 may generate an inhibit voltage Vinh applied to a non-selected memory cell. Furthermore, the voltage generating unit 140 may generate a power voltage Vdd and a precharge voltage Vpre or the like applied to write/read circuit 120.

In the illustrated example of FIG. 2, the row decoder 150 is connected to the memory cell array 110 via word lines WL and may be used to activate a selected word line from among the word lines WL in response to a row address X_ADDR received from the control logic 130. That is, the row decoder 150 may control a voltage applied to a selected word line from among a plurality of word lines WL and control connection of selected word lines in response to a row address X_ADDR.

The column decoder 160 is connected to the memory cell array 110 via bit lines BL and may be used to activate a selected bit line from among the bit lines BL in response to a column address Y_ADDR received from the control logic 130. That is, the column decoder 160 may control a voltage applied to a selected bit line from among a plurality of bit lines BL and control a connection of selected bit lines in response to a column address Y_ADDR.

Figure 6A:
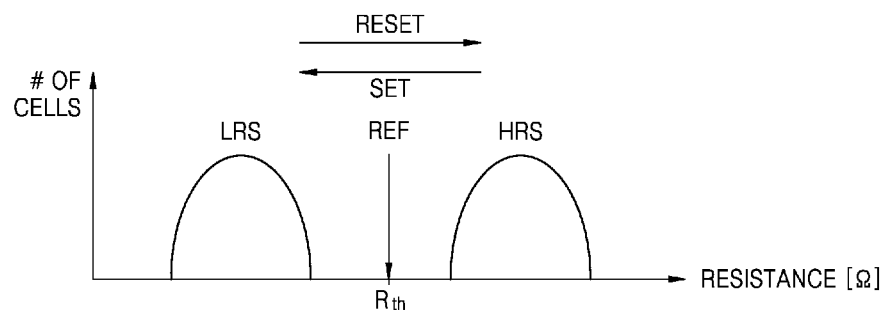
FIG. 6A is a graph showing a distribution of single-level memory cells according to resistance.

FIG. 6A is a graph illustrating a distribution of memory cells according to resistance state for single-level memory cells (SLC).

Referring to FIG. 6A, the horizontal axis denotes resistance and vertical axis denotes a number of memory cells. Thus, the SLC is programmed may have a low-resistance state (LRS) or a high-resistance state (HRS). An operation applying a write pulse to the SLC to switch the SLC from the HRS to the LRS may be referred to as a "set operation" or a "set write operation", while an operation applying a write pulse to the SLC to switch the SLC from the LRS to the HRS may be referred to as a "reset operation" or a "reset write operation".

An arbitrary resistance level between the LRS resistance distribution and the HRS resistance distribution may be selected as a "threshold resistance" Rth. During a read operation directed to a SLC, if a read result is greater than the threshold resistance Rth, it is determined that the SLC is in the HRS. However, if the read result is equal to or less than the threshold resistance Rth, it is determined that the SLC is the LRS.

In certain embodiments of the inventive concept, information defining a read reference REF corresponding to the threshold resistance Rth may be received in the memory device 100 from the memory controller 200. The control logic 130 may be used to set a read condition according to information defining the read reference REF, where the read condition may include information defining voltage(s), current(s) and/or control signal(s) provided to the read circuit 121.

Figure 6B:
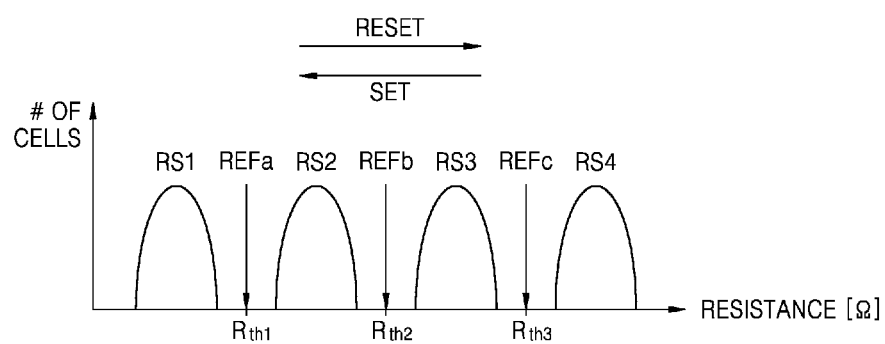
FIG. 6B is a graph showing a distribution of multi-level memory cells according to resistance.

FIG. 6B is a graph illustrating a distribution of memory cells according to resistance state for multi-level memory cells (MLC).

Here, a 2-bit MLC is assumed that may be programmed to a first resistance state RS1, a second resistance state RS2, a third resistance state RS3, and a fourth resistance state RS4. However, the embodiments of the inventive concept are not limited to only 2-bit MLC, but certain MLC may be configured to store three or more bits of data per memory cell.

Certain arbitrary resistances between adjacent distributions (e.g., between the first resistance state RS1 and second resistance state RS2; between the second resistance state RS2 and third resistance state RS3; and between the third resistance state RS3 and fourth resistance state RS4) may be selected to discriminate between the adjacent pair of resistance state distributions. And in a manner similar to that of the SLC, a read operation may be executed in relation to first, second and third threshold resistances Rth1, Rth2, and Rth3 in the illustrated example of FIG. 6B.

Information defining first second and third read references REFa, REFb, and REFc corresponding to the first, second and third threshold resistances Rth1, Rth2, and Rth3 may be received in the memory device 100 from the memory controller 200. The control logic 130 may be used to set read conditions based on information defining the read references REFa, REFb, REFc, and the read conditions may include information about at least one of a voltage, a current, and a control signal applied to the read circuit 121.

FIG. 6A or 6B illustrates ideal resistance state distributions for respective SLC and MLC. Real life resistance state distributions for SLC and MLC may be characterized by valleys formed between adjacent resistance states, and such valleys greatly affect the sensing (or discrimination) margins between the adjacent resistance states. Also, after a predetermined period of time following execution of a write operation, even SLC and MLC exhibiting ideal or near ideal resistance states like those illustrated in FIG. 6A or 6B will degrade. Such changes in resistance state distribution(s) may be caused by various time dependent factors including temperature fluctuation, electro-magnetic coupling effects, memory cell fabrication defects, etc.

When a read operation is performed on memory cells having a materially changed resistance state distribution using normally defined read references (e.g., REF, REFa, REFb, or REFc), one or more read errors is likely to be generated. However, by adjusting (or "optimizing"—meaning better optimizing) read references used during a read operation away from their normally defined levels a better read result may be obtained. That is, by adjusting normal read reference(s) used during normal read operations to generate condition-appropriate retry reference(s) used during read retry operations, a reduced number of read errors may result.

Figure 7:
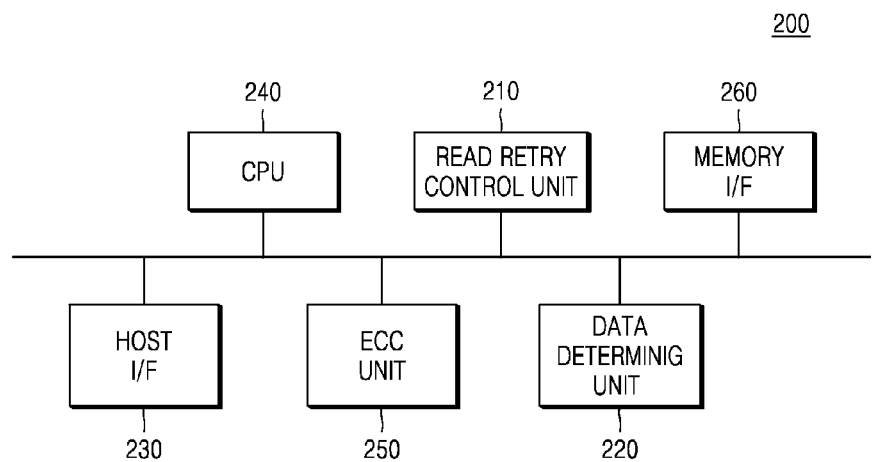
FIG. 7 is a block diagram further illustrating in one example the memory controller 200 of FIG. 1.

FIG. 7 is a block diagram further illustrating in one example the memory controller 200 of FIG. 1.

Referring to FIG. 7, the memory controller 200 comprises a read retry control unit 210, a data determining unit 220, a host interface 230, a central processing unit (CPU) 240, an error correction code (ECC) unit 250, and a memory interface 260.

The host interface 230 is used to create a communications interface between the memory controller 200 and host. For example, the host interface 230 may receive various requests (e.g., write/read requests) along with associated data from the host, and may generate various internal signals related to a requested memory operation to be performed by the memory device 100. In this regard, the memory controller 200 may communicate with the host by using at least one of various interface protocols including USB, MMC, PCI-E, Advanced Technology Attachment (ATA), Serial-ATA, Parallel-ATA, SCSI, ESDI, and Integrated Drive Electronics (IDE).

The CPU 240 may be used to control the overall operation of the memory controller 200, and may control various functional blocks related to memory operation(s) performed by the memory device 100.

The ECC unit 250 may be used to perform ECC encoding/decoding with respect to write data/read data. ECC decoding will generate an error detection result with respect to read data retrieved from the memory device 100, and may also be used to correct one or more read errors. The data determining unit 220 may be used to obtain certain determination results with respect to the read data retrieved from the memory device 100. For example, the bit value(s) for read data may be determined, and a further determine may be made as to whether or not the bit value is a data error. Such determinations may be made using a variety of calculation or logical computation operation(s).

The ECC unit 250 may perform ECC encoding/decoding process(es) using an algorithm such as a Reed-Solomon code, a Hamming code, or a cyclic redundancy code. Thus, an ECC encoding process may include generating a parity bit based on write data, and an ECC decoding process may include detecting an error bit from read data and correcting the detected error bit. For example, the ECC unit 250 may detect an error bit by comparing parity data (e.g., a parity bit) generated from, and stored with the write data. By reading the parity data with the read data during a read operation, a detected error bit in the read data may be corrected using a logical computation (e.g., an exclusive-OR or XOR operation) using the parity data and read data.

The ECC unit 250 may be set to have a predetermined error correction rate. However, the higher the error correction rate (i.e., the number of error bits detected in the read data) provided by the ECC unit 250, the greater the number of parity bits will be.

The memory interface 260 is used to create an interface between the memory controller 200 and memory device 100.

The memory controller 200 may provide the memory device 100 with a normal read command and corresponding normal read reference(s). According to certain embodiments of the inventive concept, normal read reference(s) may the same with respect to all memory cells (SLC or MLC) arranged in the memory cell array 110. Thus, consistent with the example of FIG. 6A, a single read reference REF may be used to read SLC. Alternately, consistent with the example of FIG. 6B, a multiple read references REFa, REFb, and REFc may be used to read MLC.

However, the memory controller 200 may also provide the memory device 100 with a read retry command and a corresponding set of read retry references. That is, in order to have the memory device 100 perform a read retry operation, the memory controller 200 may communicate a read retry command and information defining a plurality of read retry references, where the read retry references are optimized with respect to the actual (and potentially changed) resistance state distribution of the memory cells being read.

According to embodiments of the inventive concept, respective read retry reference(s) may be determined as a function of the different cell regions included in the memory cell array 110. It should be noted in this regard, that a defined group of memory cells identified by a read operation may extend across one or more cell regions. Accordingly, different sets of read retry reference(s) may be used for different memory cells disposed in different cell regions during a single read operation. For example, the memory cells arranged along and commonly connected to a selected word line may be disposed in first and second cell regions. Hence, a first group of memory cells disposed in the first cell region may be read during a read retry operation using a first set of read retry reference(s), while a second group of memory cells disposed in the second cell region may be read during the same read retry operation using a second (and possibly different) set of read retry reference(s).

Referring again to FIG. 2, the control logic 130 may include a read condition setting unit 135, where the read condition setting unit 135 is used to set a read condition to be used during a next read operation based on information defining read reference(s) received from the memory controller 200 in the form of one or more control signal(s). This read condition will include voltage(s), current(s), and/or control signal(s) applied to the read circuit 121.

When a normal read operation is performed, the read condition control unit 135 will receive information defining normal read reference(s), and will generate a normal read condition based on the information. In response, the read circuit 121 will perform a normal read operation with respect to selected memory cells under the normal read condition, and a "normal read result" generated as the result of the executed normal read operation may be stored in the page buffer 125.

When a read retry operation is performed, the read condition control unit 135 will receive information defining read retry reference(s), and will generate respective read retry conditions based on information. In response, the read circuit 121 may independently execute the read retry operation with respect to memory cells disposed in a plurality of cell regions designated in the memory cell array 110. Thus, different groups of memory cells in different cell regions may be read during the read retry operation under respective and possibly different read retry conditions, and a "read retry result" generated as the result of the executed read retry operation may be stored in the page buffer 125.

Figure 8:
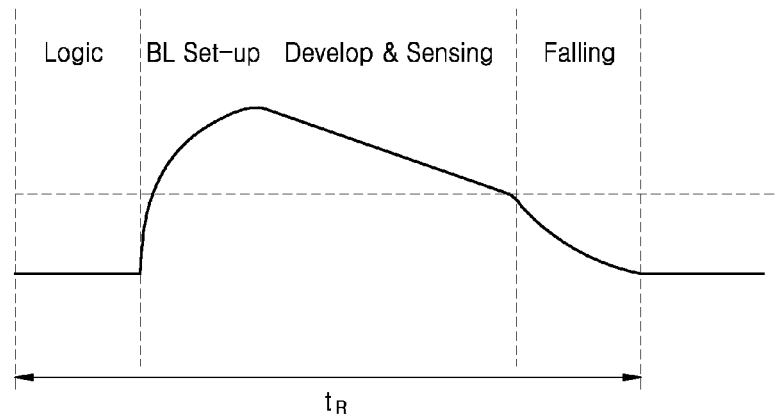
FIG. 8 illustrates a waveform diagram illustrating voltage at a sensing node in relation to the time required to execute a read operation in the memory cell array of FIG. 2.

FIG. 8 is a waveform diagram and corresponding table illustrating a voltage apparent at a sensing node over a time period during which a read operation is executed with respect to memory cells of the memory cell array 110 of FIG. 2.

Referring to FIG. 8, the "sensing node" may be a node between a selected bit line BL and the read circuit 121 connected to a selected memory cell. The sensing node will be described below in some additional detail with reference to FIGS. 14, 15, 16, 17, 18 and 19. A time period from when the memory controller 200 applies a read command to when a read operation performed on a selected memory cell is completed is referred to as a (total) read time $t_R$.

The execution of a read operation may be understood as including a sequence of sub-operations. For example, a sub-operation of selecting a memory cell such as a command and address decoding operation may be performed during a logic time period, and a set up sub-operation with respect to a bit line connected to the selected memory cell may be performed thereafter so that the bit line is precharged to a predetermined level. A develop/sensing sub-operation during which a current flows through the selected memory cell, such that a voltage applied to the sensing node varies and data stored in the selected memory cell is sensed may next be performed. Then, the voltage apparent on the bit line is discharged. These sub-operations are repeatedly performed during each read operation.

As illustrated in the table portion of FIG. 8, the total time $t_R$ required for execution of a read operation by a resistive memory is relatively shorter than that for other types of non-volatile memory. That is, a read operation may be executed by a ReRAM or a PRAM in less than one microsecond which is about forty times faster than the execution of a read operation in a flash memory. Accordingly, a flash memory may read data from a relatively large number of memory cells during one read operation, whereas a resistive memory may read data from relatively fewer memory cells using multiple read operations.

FIGS. 9A, 9B, 9C and 9D illustrate different configurations for the page buffer 125 of FIG. 2.

Figure 9A:
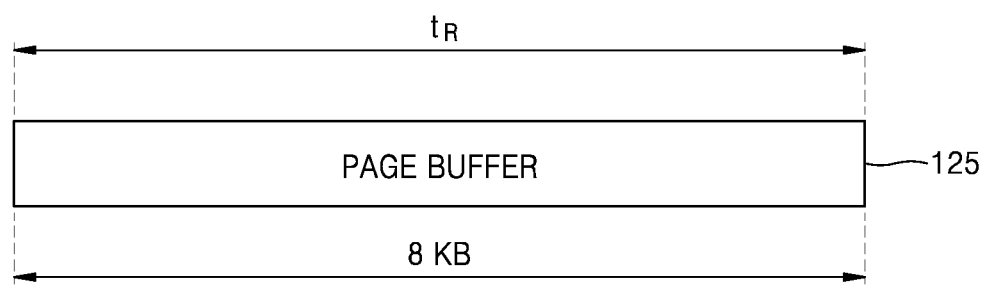
FIGS. 9A, 9B, 9C and 9D are respective conceptual diagrams illustrating in various examples the page buffer 125 of FIG. 2.

Referring to FIG. 9A, the size of the page buffer 125 may be assumed to be 8 KB, for example. That is, the size of the page buffer 125 that operates during one read operation executed during a total read time $t_R$ is 8 KB in the illustrated example of FIG. 9A. Hence, read data is stored in the entire page buffer 125 during one read operation. If one read reference is uniformly applied to selected memory cells during a read operation, 8 KB worth of memory cells will be simultaneously the selected and the 8 KB of read data will be simultaneously stored in the page buffer 125.

Figure 9B:
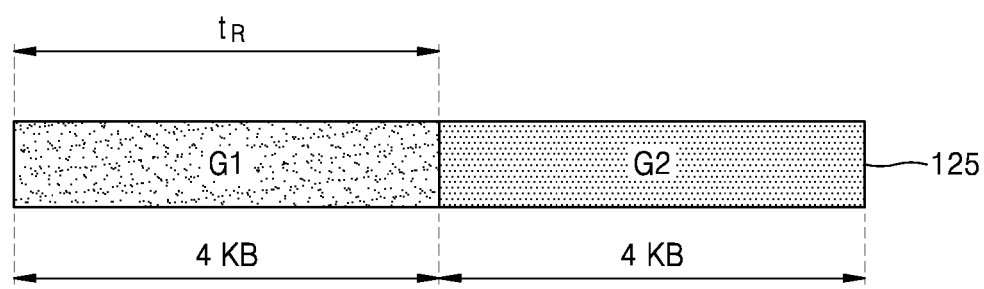

Referring to FIG. 9B, the size of the page buffer 125 is again assumed to be 8 KB. However, the selected memory cells may be divided into a first cell region G1 and a second cell region G2 according to physical addresses, and the page buffer 125 may be assigned to both of the first cell region G1 and the second cell region G2 according to a physical address.

Thus, the page buffer 125 may be operated during a read operation in two (2) 4 KB portions, where data may be stored in a portion of the page buffer 125 during one read operation. According to the embodiment illustrated in FIG. 9B, a read operation may be performed during a total read time $t_R$ with respect to the first cell region G1, and another read operation may be performed during a total read time $t_R$ with respect to the second cell region G2. Accordingly, respective read operations may be simultaneously performed during the total read time $t_R$ with respect to the first cell region G1 and the second cell region G2.

Data read from memory cells corresponding to the first cell region G1 may be stored in a portion of the page buffer 125, and for example, a size of a portion of the page buffer 125 that is assigned to the first cell region G1 may be 4 KB. Also, data read from memory cells corresponding to the second cell region G2 may be stored in another portion of the page buffer 125, and a size of a portion of the page buffer 125 that is assigned to the second cell region G2 may be 4 KB.

Figure 9C:
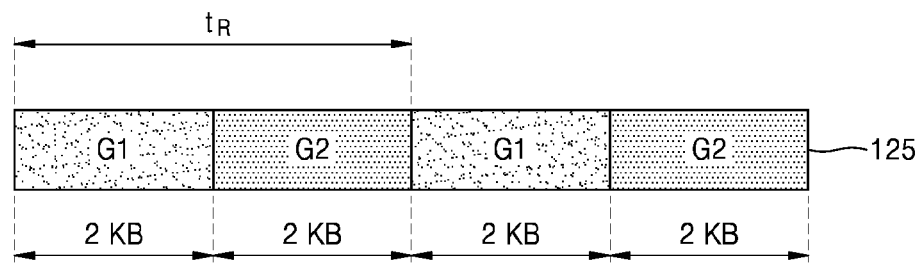

Referring to FIG. 9C, the size of the page buffer 125 is again assumed to be 8 KB. However, selected memory cells may be divided into a first cell region G1 and a second cell region G2 according to a logical address, and the page buffer 125 may be assigned to both of the first cell region G1 and the second cell region G2 according to a logical address.

Here again, a portion of the page buffer 125 that operates during one read operation executed during one total read time $t_R$ may be assumed to be 4 KB. In other words, data may be stored in a portion of the page buffer 125 during one read operation. A read operation may be performed during a total read time $t_R$ with respect to a portion of the first cell region G1 and a portion of the second cell region G2, and then a read operation may be performed during another total read time $t_R$ with respect to the rest of the first cell region G1 and the rest of the second cell region G2. Alternately, a read operation may be simultaneously performed during the total read time $t_R$ with respect to the first cell region G1 and the second cell region G2.

Figure 9D:
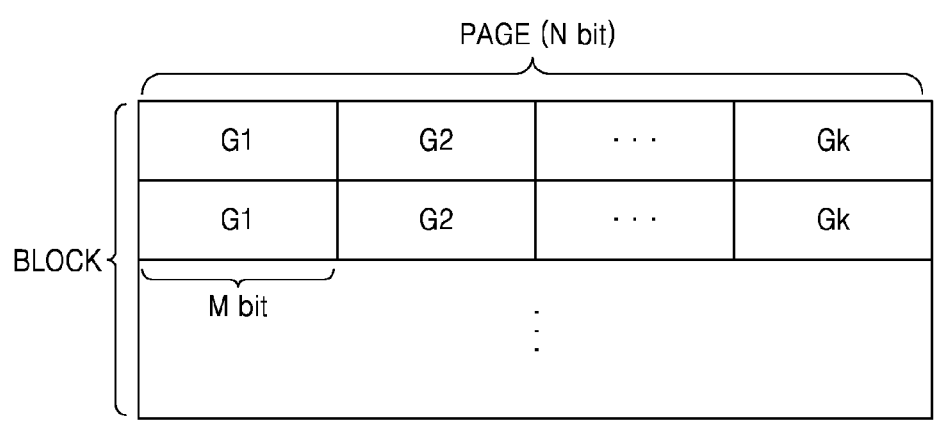

Referring to FIG. 9D, a memory block BLOCK included in the memory cell array 110 is assumed to include a plurality of pages (PAGE), where each page is divided into a plurality of cell regions G1 through Gk. The size of each page is assumed to be N bits, and a size of each of cell regions G1 through Gk is assumed to be M bits, where M is less than N. Although each page of FIG. 9D is divided into the same number of cell regions, other embodiments of the inventive concept will have different configurations, and respective pages may be divided into a different numbers of cell regions.

Figure 10:
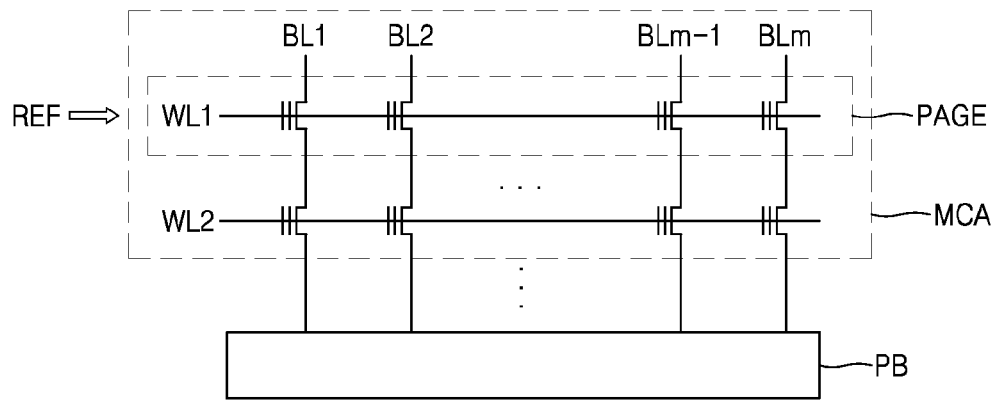
FIG. 10 is a block diagram illustrating a memory cell array and page buffer that may be included in a comparative example of a NAND flash memory device.

FIG. 10 is a block diagram illustrating a memory cell array MCA and a page buffer PB that may be included in a NAND flash memory device.

Referring to FIG. 10, memory cells included in the memory cell array MCA are connected to the same word line in units of pages (PAGE), and accordingly, the same word line voltage is applied to a plurality of memory cells included in each page. When performing a read operation on a page, a read voltage according to a read reference REF is applied to a word line WL1, and a read result is stored in a page buffer (PB) connected to bit lines BL1 through BLm.

As described above, in a NAND flash memory, a read reference REF for performing a read operation is a read voltage applied to the word line WL1. Accordingly, memory cells included in the page is connected to the same word line WL1, and thus, a read operation is performed according to the same read reference REF. Accordingly, when performing a read operation or read retry operation, memory cells included in the page may be divided into a plurality of cell regions.

The page buffer simultaneously stores read data from the memory cells included in the page. In this case, the size of the page buffer is assumed to be the same size as data read during a total read time $t_R$ from the memory cells included in the page.

Figure 11:
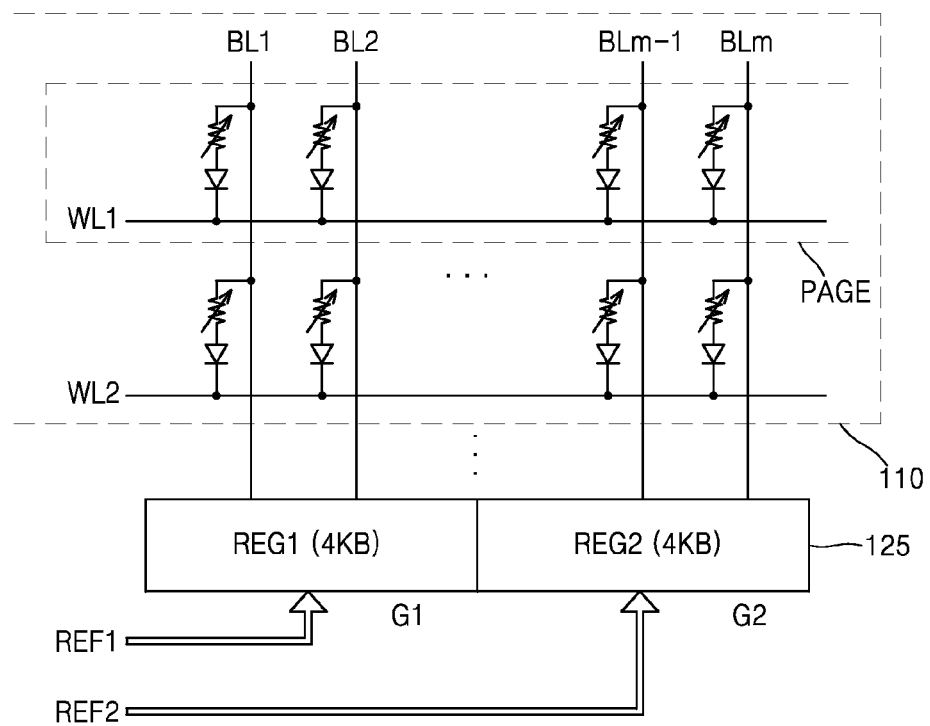
FIG. 11 is a block diagram illustrating a memory cell array and page buffer that may be included in the memory device of FIG. 2 according to certain embodiment of the inventive concept.

FIG. 11 is a block diagram further illustrating in one example the memory cell array 110 and page buffer 125 of FIG. 2 according to an embodiment of the inventive concept.

Referring to FIG. 11, memory cells included in the memory cell array 110 are connected to the same word line in page units (PAGE), and accordingly, the same word line voltage is applied to a plurality of memory cells included in a page.

When performing a read operation on a selected page illustrated in FIG. 11, the same voltage (e.g., a ground voltage Vss) may be applied to a word line WL1. Also, read conditions according to different read references REF1 and REF2 may be applied to the read circuit 121 (see FIG. 2) connected to bit lines BL1 through BLm, and a read result is stored in the page buffer 125 connected to the bit lines BL1 through BLm.

As described above, the read references REF1 and REF2 used to perform a read operation are applied in a bit line direction, and since memory cells included in the page are respectively connected to difference bit lines, different read references REF1 and REF2 may be effectively applied to the memory cells included in common page. That is, different read references REF1 and REF2 may be applied to bit lines connected to memory cells arranged in respective cell regions of a memory cell array. Accordingly, unlike a NAND flash memory example described above, during a single read operation (normal and/or read retry) executed during a total read time $t_R$, multiple read operations may be respectively and independently executed in relation to (e.g.,) first and second cell regions G1 and G2 using different read references REF1 and REF2.

Hence, with respect to the example shown in FIG. 11, the page buffer 125 may be divided into a first region REG1 assigned to the first cell region G1 and a second region REG2 assigned to the second cell region G2. Data read from the first cell region G1 according to the first read reference REF1 may be stored in the first region REG1, and data read from the second cell region G2 according to the second read reference REF2 may be stored in the second region REG2.

As described above, data read according to the different read references REF1 and REF2 may be independently stored in the page buffer 125. That is, data read according to the first reference REF1 and data read according to the second reference REF2 may be simultaneously stored in the page buffer 125. Alternately, data read according to the first reference REF1 and data read according to the second reference REF2 may be sequentially stored in the page buffer 125. As described above with reference to FIG. 8, a resistive memory has a far shorter total read time $t_R$ than a NAND flash memory, for example. Thus, even when read operations are sequentially executed on the first and second cell regions G1 and G2 of a resistive memory, the cumulative total read time for the resistive memory will be much shorter than a read time executed by a NAND flash memory.

Figure 12:
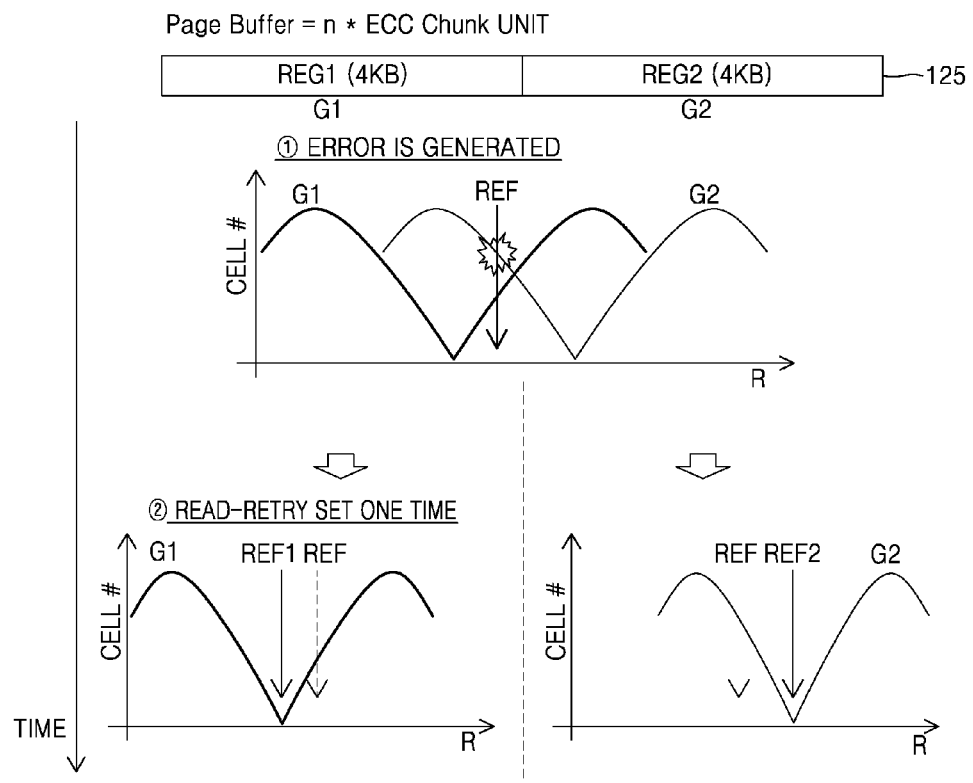
FIG. 12 is a conceptual diagram illustrating execution of a reading operation in relation to the memory device of FIG. 11 according to embodiments of the inventive concept.

FIG. 12 is a conceptual diagram illustrating execution of a read operation using a memory device like the one described with reference to the memory device of FIG. 11.

Referring to FIG. 12, a plurality of memory cells included in a page are divided into first and second cell regions G1 and G2. Accordingly, the page buffer 125 may be operationally divided into the first buffer region REG1 assigned to the first cell region G1 and the second buffer region REG2 assigned to the second cell region G2.

First, as a result of performing a normal read operation on the memory cells of the selected page, a read error may be generated. That is, when performing a normal read operation on the all of the memory cells included in the page using a normal read reference REF, a read error is generated due to a difference in distributions for the first cell region G1 and the second cell region G2 (e.g., a local variation associated with the memory cell array 110).

Then, a read retry operation is executed with respect to the first and second cell regions G1 and G2. That is, a read retry operation on the first cell region G1 and a read retry operation on the second cell region G2 may be simultaneously performed, or a read retry operation is performed according to the first read reference REF1 with respect to the first cell region G1, and a read retry operation may be performed according to the second read reference REF2 with respect to the second cell region G2. The first read reference REF1 may correspond to a valley between the two adjacent distributions of memory cells included in the first cell region G1, and the second read reference REF2 may correspond to a valley between two adjacent distributions of memory cells included in the second cell region G2.

According to an embodiment illustrated in FIG. 12, a read retry operation on the first cell region G1 and a read retry operation on the second cell region G2 may be simultaneously performed. Alternately, a read retry operation on the first cell region G1 and a read retry operation on the second cell region G2 may be sequentially performed. As described above, a resistance memory has a far shorter read time $t_R$ needed for one read operation than a NAND flash memory, and thus, even when a read operation is sequentially performed on the first and second cell regions G1 and G2, the whole read time of a resistive memory is shorter than a read time of a NAND flash memory.

Although not illustrated, a read retry operation according to the present embodiment may be repeated several times, and accordingly, first and second valleys with respect to the first and second cell regions G1 and G2 may be searched for or predicted. Read references in the repeated read retry operations may be modified slightly. That is, a read retry operation may be performed again according to a first adjusted read reference REF1' that is different from the first read reference REF1 on the first cell region G1, and a read retry operation may be performed again according to a second adjusted read reference REF2' that is different from the second read reference REF2, on the second cell region G2.

The first amended read reference REF1' may include a lower resistance level than the first read reference REF1, and the second amended read reference REF2' may include a higher resistance level than the second read reference REF2. Accordingly, a valley between two distributions adjacent to the first cell region G1 may be searched for or predicted, and a valley between two distributions adjacent to the second cell region G2 may be searched for or predicted.

Each read retry operation may be independently performed on each of the first and second cell regions G1 and G2 during a relatively short total read time, and thus, a valley may be independently searched for or predicted with respect to the first and second cell regions G1 and G2. Thus, local variation in the memory cell array 110 may be compensated, and moreover, read performance and yield of a memory device may be improved overall.

Figure 13A:
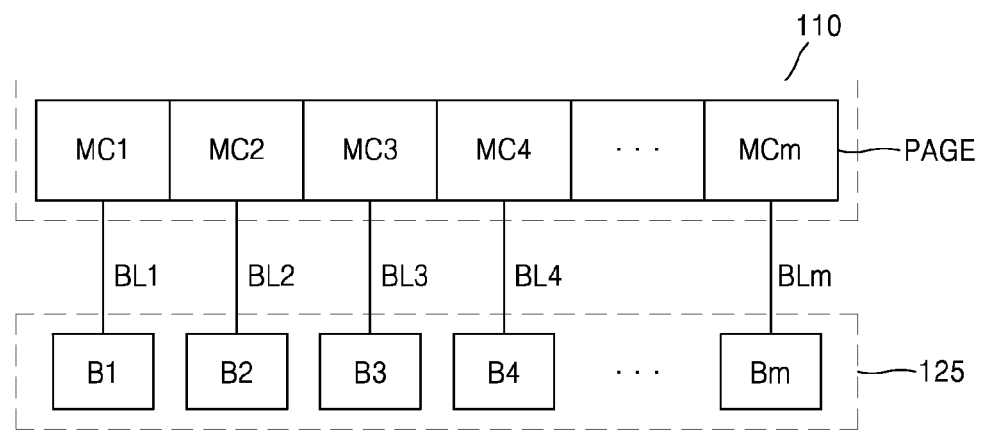
FIGS. 13A and 13B are conceptual diagrams illustrating possible connections between the memory cell array and page buffer of FIG. 2.
Figure 13B:
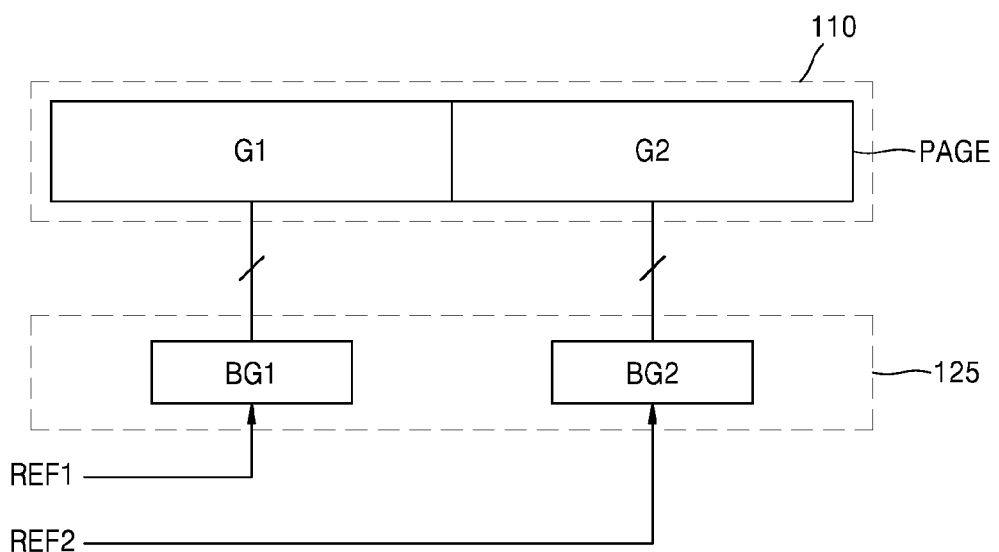

FIGS. 13A and 13B illustrate possible connections between the memory cell array 110 and page buffer 125 of FIG. 2 according to certain embodiments of the inventive concept.

Referring to FIG. 13A, the memory cell array 110 may include a page (PAGE), where the page includes 'm' memory cells MC1 through MCm. While only one page is included in the memory cell array 110 in FIG. 13A for convenience of explanation, the memory cell array 110 may include many pages.

The page buffer 125 include a plurality of buffers B1 through Bm, which may be respectively connected to the memory cells MC1 through MCm via corresponding bit lines BL1 through BLm. The plurality of buffers B1 through Bm may temporarily store data to be written to the memory cell array 110 or data read from the memory cell array 110.

Referring to FIG. 13B, the memory cell array 110 again includes a page (PAGE), where the page includes first and second cell regions G1 and G2. Here however, some of memory cells are grouped into the first cell region G1, and some other memory cells are grouped into the second cell region G2. The number of cell regions divided from the page may vary, and the size of each cell region may be determined (e.g.,) according to characteristics of a constituent ECC unit.

Hence, the page buffer 125 may include a first buffer group BG1 assigned to the first cell region G1 and a second buffer group BG2 assigned to the second cell region G2. The first buffer group BG1 may include a plurality of buffers respectively corresponding to a plurality of memory cells included in the first cell region G1, and the second buffer group BG2 may include a plurality of buffers respectively corresponding to a plurality of memory cells included in the second cell region G2. According to the present embodiment, the first buffer group BG1 corresponds to the first buffer region REG1 of FIG. 12 and the first read reference REF1 may be applied thereto, and the second buffer group BG2 corresponds to the second buffer region REG2 of FIG. 12 and the second read reference REF2 may be applied thereto.

Figure 14:
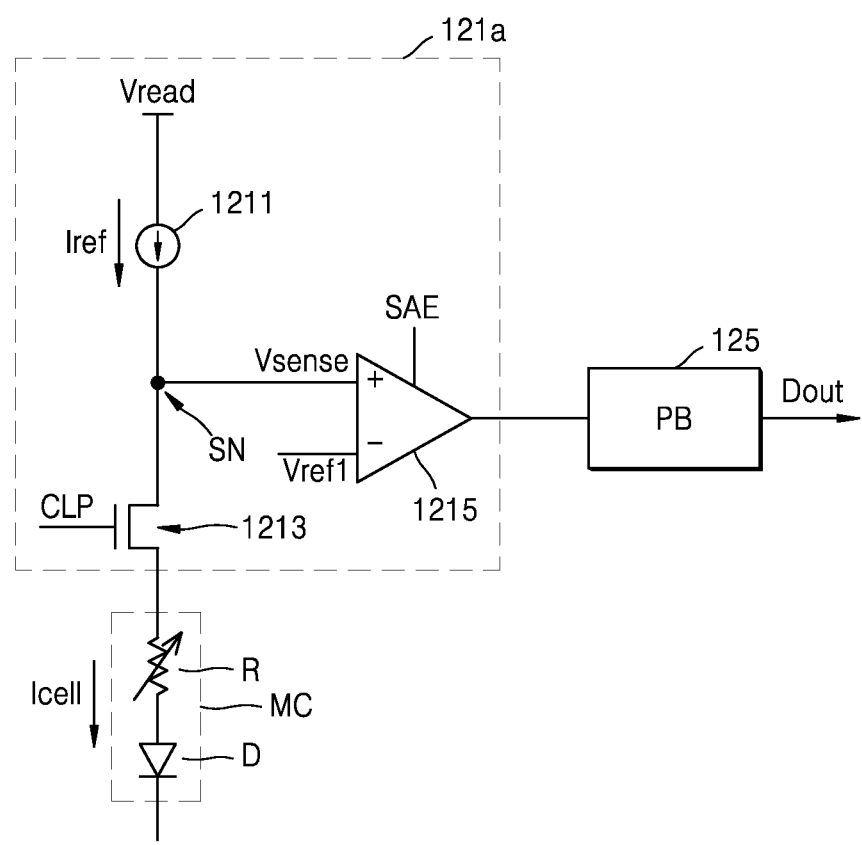
FIGS. 14 and 15 are respective circuit diagrams illustrating in various examples the read circuit of FIG. 2.

FIG. 14 is a circuit diagram further illustrating in one example (121a) the read circuit 121 of FIG. 2.

Referring to FIG. 14, the read circuit 121a may be used to read data stored in a memory cell (MC) based on a cell current Icell flowing to the memory cell. The read circuit 121a of FIG. 14 includes a current generating unit 1211, a clamping unit 1213, and a sense amp 1215. However, the structure of the read circuit 121 is not limited thereto, and the read circuit 121 may have a predetermined structure in which data stored in the memory cell may be read by comparing the cell current Icell flowing through the memory cell with a reference current Iref. Hereinafter, elements of the read circuit 121a according to the illustrated embodiment will be described.

The current generating unit 1211 is connected between a read voltage terminal Vread and a sensing node SN to generate the reference current Iref. For example, the current generating unit 1211 may include a current mirror circuit consisting of two transistors. The reference current Iref may be determined in advance based on characteristics of the memory cell MC or the cell current Icell, and a transistor included in the current mirror circuit may be selected based on the determined reference current Iref.

The read condition setting unit 135 may be used to set a read voltage Vread or reference current Iref according to read references. The read condition setting unit 135 may provide the voltage generating unit 140 with a voltage control signal CTRL_vol according to the set read voltage Vread or the set reference current Iref. The voltage generating unit 140 may generate a read voltage Vread according to the voltage control signal CTRL_vol and provide the same to the read circuit 121*a*.

The clamping unit 1213 is connected between the sensing node SN and the memory cell MC to clamp a bit line voltage $V_{BL}$ within a range that is appropriate for reading. In detail, the clamping unit 1213 may clamp a bit line voltage $V_{BL}$ according to a clamping signal CLP. That is, the bit line voltage $V_{BL}$ may be determined based on the clamping signal CLP. For example, the clamping unit 1213 may be an NMOS transistor 1213 that includes a gate to which a clamping signal CLP is input, a drain connected to the sensing node SN, and a source connected to the memory cell MC.

The read condition setting unit 135 may set the clamping signal CLP according to read references. The read condition setting unit 135 may provide the voltage generating unit 140 with a voltage control signal CTRL_vol according to the set clamping signal CLP. The voltage generating unit 140 may generate a clamping signal CLP according to the voltage control signal CTRL_vol and provide the same to the read circuit 121*a*.

The sense amp 1215 may compare a sensing voltage Vsense, which is a voltage of the sensing node, with a reference voltage Vref1, and may sense or read data stored in the memory cell MC according to a result of comparing the voltages. Also, the sense amp 1215 may perform a sensing operation according to a sense amp enable signal SAE. That is, the sense amp 1215 may perform a sensing operation when the sense amp enable signal SAE is activated.

A sensing voltage Vsense may be applied to a non-inverting input terminal, and a reference voltage Vref1 may be applied to an inverting input terminal of the sense amp 1215. Next, if the sensing voltage Vsense is higher than the reference voltage Vref1, the sense amp 1215 may provide an output having a logic level of '1', and if the sensing voltage Vsense is lower than the reference voltage Vref1, the sense amp 1215 may provide an output having a logic level of '0'.

The read condition setting unit 135 may be used to set the reference voltage Vref1 or the sense amp enable signal SAE according to read references. The read condition setting unit 135 may provide the voltage generating unit 140 with a voltage control signal CTRL_vol according to the set reference voltage Vref1. The voltage generating unit 140 may generate the reference voltage Vref1 according to the voltage control signal CTRL_vol and provide the same to the read circuit 121*a*. Also, the read condition setting unit 135 may adjust an activation timing of the sense amp enable signal SAE according to the set sense amp enable signal SAE and provide an operational control signal CTRL_op to the read circuit 121*a*.

An exemplary read operation for the memory device 100 of FIG. 1 using the read circuit 121*a* of FIG. 14 will be described.

The clamping unit 1213 may clamp a bit line voltage $V_{BL}$ to a predetermined level, and accordingly, a cell current Icell flowing to the memory cell may be determined to be in proportional to a resistance level of the memory cell with respect to the bit line voltage $V_{BL}$ of the predetermined level. If the cell current Icell is higher than the reference current Iref, the sensing voltage Vsense is reduced, and if the cell current Icell is lower than the reference voltage Iref, the sensing voltage Vsense is increased. Accordingly, data stored in the memory cell may be read by comparing the sensing voltage Vsense, which is modified according to the cell current Icell that is disproportional to the resistance level of the memory cell with the reference voltage Vref1.

For example, if a resistance level of the memory cell is a first resistance R1, the cell current Icell flowing to the memory cell is higher than the reference current Iref, and accordingly, the sensing voltage Vsense may be reduced. Accordingly, the sensing voltage Vsense is lower than the reference voltage Vref1, and thus, the sense amp 1215 may provide an output having a logic level of '0'. Consequently, it may be determined that the resistance level stored in the memory cell is the first resistance R1.

For example, if a resistance level of the memory cell is a second resistance R2, the cell current Icell flowing to the memory cell is lower than the reference current Iref, and accordingly, the sensing voltage Vsense may be increased. Accordingly, the sensing voltage Vsense is higher than the reference voltage Vref1, and thus, the sense amp 1215 may provide an output having a logic level of '1'. Consequently, it may be determined that the resistance level stored in the memory cell MC is the second resistance R2.

As described above, an operation of the read circuit 121*a* may be varied according to read conditions such as a voltage applied to the read circuit 121*a* (e.g., Vread, Vref1, or $V_{CLP}$), a current (e.g., Iref), or a control signal (e.g., SAE). Thus, if a read condition is modified, an output of the sense amp 1215 will also be modified.

Referring to FIG. 12 again, the first read reference REF1 corresponding to the first cell region G1 is moved to the left from the normal read reference REF, that is, in a direction in which resistance decreases. In this case, the read condition setting unit 135 may set, according to the first read reference REF1, a first read condition under which at least one of a reference voltage Vref1 applied to the sense amp 1215, a reference current Iref generated in the current generating unit 1211, and a read voltage Vread applied to the current generating unit 1211 is increased.

Meanwhile, the second read reference REF2 corresponding to the second cell region G2 is moved to the right from the normal read reference REF, that is, in a direction in which resistance is increased. In this case, the read condition setting unit 135 may set, according to the second read reference REF2, a second read condition under which at least one of a reference voltage Vref1 applied to the sense amp 1215, a reference current Iref generated in the current generating unit 1211, and a read voltage Vread applied to the current generating unit 1211 is reduced.

Figure 15:
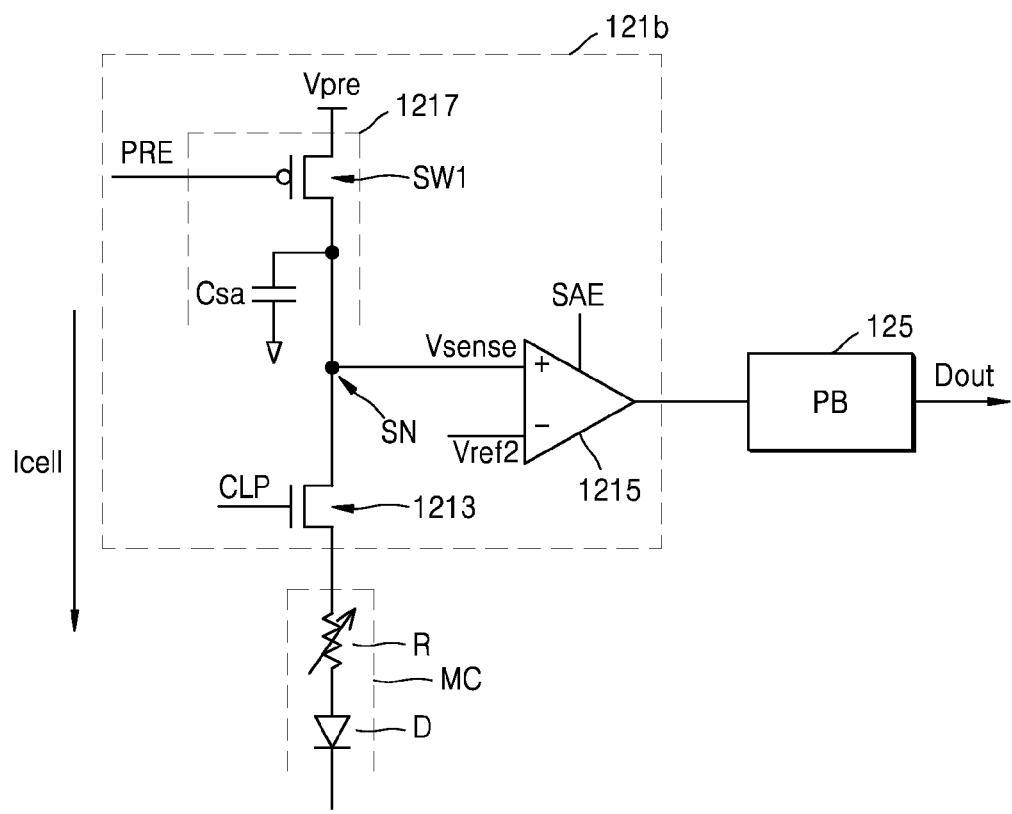

FIG. 15 is a circuit diagram further illustrating in another example (121*b*) the read circuit 121 of FIG. 2.

Referring to FIG. 15, the read circuit 121*b* may read data stored in a memory cell MC based on a sensing voltage Vsense at a sensing timing ts. As shown in FIG. 15, the read circuit 121*b* includes a precharge unit 1217, a clamping unit 1213, and a sense amp 1215. However, a structure of the read circuit 121*b* is not limited thereto, and the read circuit 121*b* may have a predetermined structure in which data stored in the memory cell MC may be read by comparing a sensing voltage Vsense with a reference voltage Vref2 at a sensing timing ts. Hereinafter, elements of the read circuit 121*b* according to the present embodiment will be described.

The precharge unit 1217 may precharge a sensing voltage Vsense, which is a voltage level of a sensing node SN, to a predetermined voltage such as a precharge voltage Vpre during a precharge section before a read operation or a sensing operation. According to the present embodiment, the precharge unit 1217 may include a switch SW1 connected between a precharge voltage terminal Vpre and the sensing node SN and a capacitor Csa connected to the sensing node SN.

The switch SW1 may be switched according to a precharge enable signal PRE, and in detail, may be a PMOS transistor including a gate to which the precharge enable signal PRE is applied, a source connected to the precharge voltage terminal Vpre, and a drain connected to the sensing node SN. The capacitor Csa may be precharged to the precharge voltage Vpre according to a switching operation of the switch SW1 according to the precharge enable signal PRE. Thus, capacitance of the capacitor Csa may be modified according to the precharge voltage Vpre applied to the precharge unit 1217 and the precharge enable signal PRE.

According to the present embodiment, the read condition setting unit 135 may set a precharge voltage Vpre, a precharge enable signal PRE or a charge amount charged in the capacitor Csa according to read references. The read condition setting unit 135 may provide the voltage generating unit 140 with a voltage control signal CTRL_vol according to the set precharge voltage Vpre. Also, the read condition setting unit 135 may adjust an activation timing of the precharge enable signal PRE according to the set precharge enable signal PRE and provide an operational control signal CTRL_op to the read circuit 121b.

The clamping unit 1213 may be connected between the sensing node SN and the memory cell (MC) and clamp a bit line voltage within a range appropriate for reading. In detail, the clamping unit 1213 may clamp a bit line voltage $V_{BL}$ to a predetermined level according to a clamping signal. In other words, the bit line voltage $V_{BL}$ may be determined based on the clamping signal CLP. For example, the clamping unit 1213 may be an NMOS transistor 1213 that includes a gate to which the clamping signal CMP is input, a drain connected to the sensing node SN, and a source connected to the memory cell.

The read condition setting unit 135 may be used to set a clamping signal CMP according to read references. The read condition setting unit 135 may provide the voltage generating unit 140 with a voltage control signal CTRL_vol according to the set clamping signal CLP. The voltage generating unit 140 may generate a clamping signal CLP according to the voltage control signal CTRL_vol and provide the same to the read circuit 121b.

The sense amp 1215 may compare a sensing voltage Vsense, which is a voltage of the sensing node, with a reference voltage Vref2, and may sense or read data stored in the memory cell according to a result of comparing the voltages. The reference voltage Vref2 may be determined in advance based on characteristics of the memory cell or a mode determination signal MD. Also, the sense amp 1215 may perform a sensing operation according to a sense amp enable signal SAE; in detail, the sense amp 1215 may perform a sensing operation when the sense amp enable signal SAE is activated.

That is, a sensing voltage Vsense may be applied to a non-inverting input terminal of the sense amp 1215, and a reference voltage Vref2 may be applied to an inverting input terminal of the sense amp 1215. Next, if the sensing voltage Vsense is higher than the reference voltage Vref2, the sense amp 1215 may provide an output having a logic level of '1', and if the sensing voltage Vsense is lower than the reference voltage Vref2, the sense amp 1215 may provide an output having a logic level of '0'.

The read condition setting unit 135 may be used to set a reference voltage Vref2 or a sense amp enable signal SAE according to read references. The read condition setting unit 135 may provide the voltage generating unit 140 with a voltage control signal CTRL_vol according to the set reference voltage Vref2. The voltage generating unit 140 may generate a reference voltage Vref2 according to the voltage control signal CTRL_vol and provide the same to the read circuit 121b. Also, the read condition setting unit 135 may adjust an activation timing of the sense amp enable signal SAE according to the set sense amp enable signal SAE and provide an operational control signal CTRL_op to the read circuit 121b.

An exemplary read operation for the memory device 100 of FIG. 1 using the read circuit 121b of FIG. 15 will be described.

The precharge unit 1217 may precharge a sensing voltage Vsense to a precharge voltage level Vpre in a precharge section before a sensing section, and accordingly, the sensing voltage Vsense may have a precharge voltage level Vpre before being connected to a bit line, that is, to the memory cell. When the clamping unit 1213 is switched via the clamping signal CLP, the sensing node SN is connected to the bit line, that is, the memory cell. Accordingly, a cell current Icell flows to the memory cell according to the predetermined voltage level Vpre of the sensing voltage Vsense and a resistance level R of the memory cell.

Accordingly, the sensing voltage Vsense is reduced according to time, and a reduction time of the sensing voltage Vsense may be determined to be proportional to the resistance level R of the memory cell. When the resistance level R of the memory cell is low, the cell current Icell is increased, and consequently, a reduction time of the sensing voltage Vsense is reduced. Meanwhile, if the resistance level R of the memory cell is high, the cell current Icell is reduced, and consequently, a reduction time of the sensing voltage Vsense is increased. Thus, by adjusting a sense amp enable signal SAE, a sensing timing ts may be determined, and data stored in the memory cell may be read by comparing the sensing voltage Vsense with the reference voltage Vref2 at the sensing timing ts.

For example, if a resistance level of the memory cell is a third resistance R3 illustrated in FIG. 6B, the cell current Icell flowing to the memory cell may be relatively high, and the sensing voltage Vsense at the sensing timing ts may be smaller than the reference voltage Vref2. Thus, the sense amp 1215 may provide an output having a logic level of '0'. Consequently, it may be determined that the resistance level stored in the memory cell is the third resistance R3.

For example, if a resistance level of the memory cell is a fourth resistance R4 illustrated in FIG. 6B, the cell current Icell flowing to the memory cell may be relatively low, and the sensing voltage Vsense at the sensing timing ts may be higher than the reference voltage Vref2. Thus, the sense amp 1215 may provide an output having a logic level of '1'. Consequently, it may be determined that the resistance level stored in the memory cell is the fourth resistance R4.

Referring to FIG. 12 again, the first read reference REF1 corresponding to the first cell region G1 is moved to the left from the normal read reference REF, that is, in a direction in which resistance decreases. In this case, the control logic 130 may set, according to the first read reference REF1, a first read condition, under which, for example, a reference voltage Vref2 applied to the sense amp 1215, a precharge voltage Vpre applied to the precharge unit 1217, a timing at which the precharge enable signal PRE is inactivated, a charge amount charged in the capacitor Csa, and a sensing timing ts, at which the sense amp enable signal SAE is inactivated, are reduced.

Meanwhile, the second read reference REF2 corresponding to the second cell region G2 is moved to the right from the normal read reference REF, that is, in a direction in which resistance is increased. In this case, the control logic 130 may set, according to the second read reference REF2, a second read condition, under which, for example, a reference voltage Vref2 applied to the sense amp 1215, a precharge voltage Vpre applied to the precharge unit 1217, a timing at which the precharge enable signal PRE is inactivated, a charge amount charged in the capacitor Csa, and a sensing timing ts at which the sense amp enable signal SAE is inactivated, are increased.

FIGS. 16A, 16B, 17A, 17B, 18A and 18B (hereafter collectively, FIGS. 16A through 18B) are graphs illustrating various examples of read condition according to embodiments of the inventive concept. The operative subject matter described in the context of graphs FIGS. 16A through 18B is described with reference to the read circuits 121a and 121b of FIGS. 14 and 15.

Figure 16A:
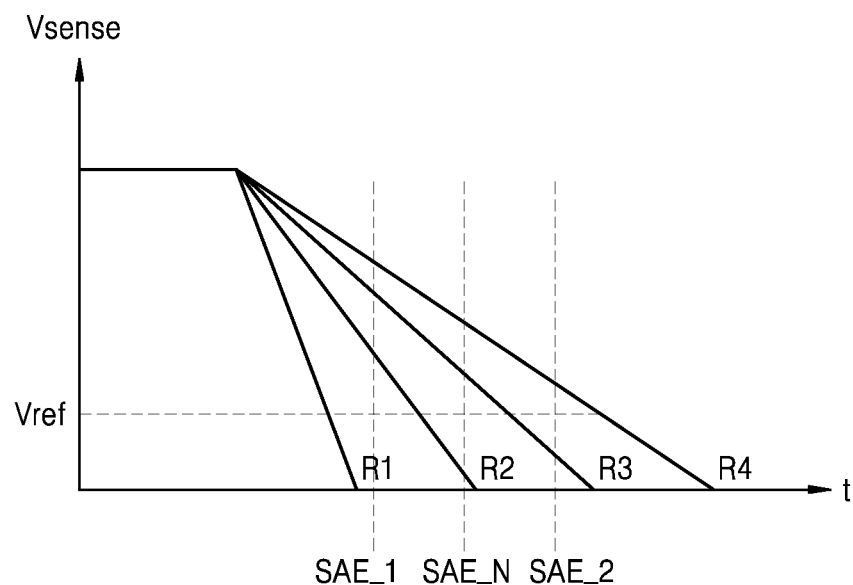
FIGS. 16A, 16B, 17A, 17B, 18A and 18B (collectively, "FIGS. 16A through 18B") illustrate various examples read conditions according to embodiments of the inventive concept.
Figure 16B:
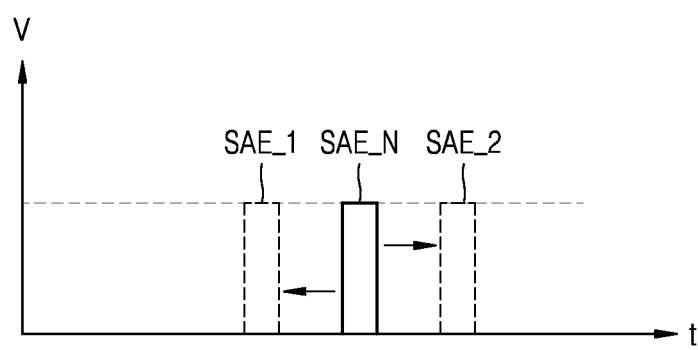

FIGS. 16A and 16B show an example of varying a read condition by adjusting an activation time of a sensing enable signal SAE. As illustrated in FIG. 16A, dropping speeds of sensing node voltages Vsense may be different according to resistances R1 through R4 of memory cells, and data of the memory cells may be read differently according to a sense amp enable signal SAE for controlling a sensing time of a sense amp.

For example, according to a sense amp enable signal SAE_N used in a normal read condition, a level of a sensing node voltage Vsense of memory cells having the third resistance state R3 and the fourth resistance state R4 at a predetermined time are higher than a reference voltage Vref, whereas a level of a sensing node voltage Vsense of memory cells having the first resistance state R1 and the second resistance state R2 may be smaller than the reference voltage Vref.

On the other hand, according to a sense amp enable signal SAE_1 used in the first read condition used in a read retry mode, a level of the sensing node voltage Vsense of memory cells having the second resistance state R2 may be higher than the reference voltage Vref. Also, according to a sense amp enable signal SAE_2 used in the second read condition used in a read retry mode, a level of a sensing node voltage Vsense of memory cells having the third resistance state R3 may be lower than the reference voltage Vref.

According to an embodiment of the inventive concept, when a first cell region included in a page is read based on the first read condition, and a second cell region included in the page is read based on the second read condition, activation times of the sense amp enable signal SAE_1 under the first read condition and the sense amp enable signal SAE_2 under the second read condition may be different as illustrated in FIG. 16B.

Even if a resistance level distribution of memory cells is varied, an activation time of the sense amp enable signal SAE where a minimum error is generated may be detected by re-reading data by varying an activation time of the sense amp enable signal SAE as described above and determining the data.

Figure 17A:
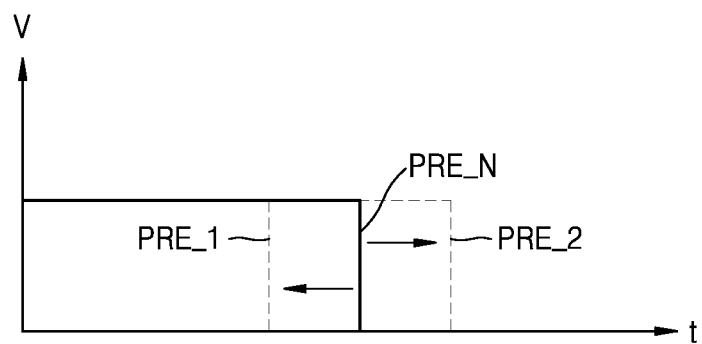
Figure 17B:
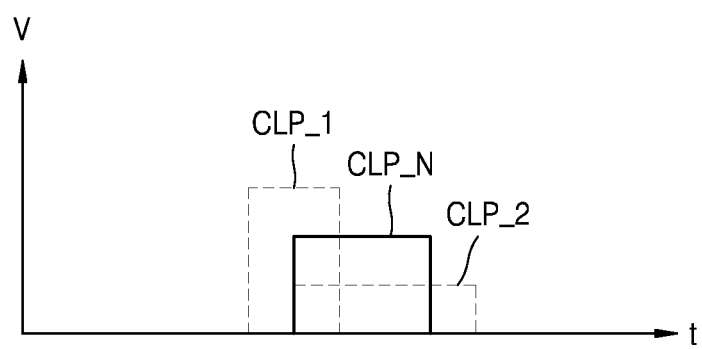

FIGS. 17A and 17B show an example of varying a read condition by modifying a precharge enable signal PRE or a clamping signal CPL.

As illustrated in FIG. 17A, a read condition may be changed by varying a section where a precharge enable signal PRE is activated. For example, a section PRE_N where a precharge enable signal PRE is activated in a general operational mode, a section PRE_1 where a precharge enable signal PRE corresponding to the first read condition in a read retry mode is activated, and a section PRE_2 where a precharge enable signal PRE corresponding to the second read condition in a read retry mode is activated may be differently set. As activation sections of the precharge enable signal PRE are different, a charge amount charged in the capacitor Csa are different, a level of the precharge voltage applied to the sensed node SN may be changed.

As illustrated in FIG. 17B, a read condition may be changed by adjusting a level and a width of a clamping signal CLP. For example, a level and/or a width of a clamping signal CLP_N in a normal operational mode may be different from those of a clamping signal CLP_1 corresponding to the first read condition in a read retry mode and a clamping signal CLP_2 corresponding to the second read condition in a read retry mode. By adjusting the level and the width of the clamping signal CLP, a level of a voltage applied to the sensing node SN may be varied.

Figure 18A:
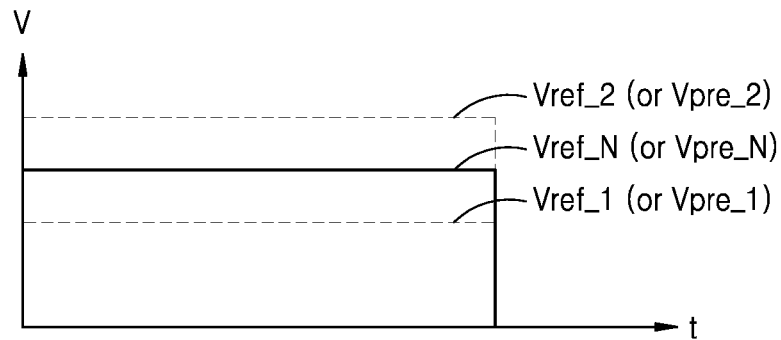
Figure 18B:
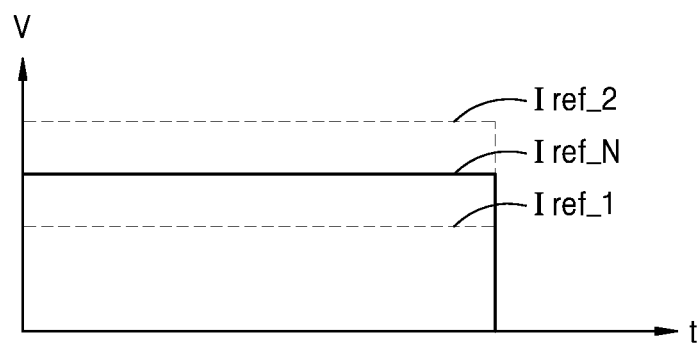

FIGS. 18A and 18B show an example of varying a read condition by varying a level of a reference voltage Vref, a reference current Iref, a precharge voltage Vpre or the like.

As illustrated in FIG. 18A, a level of a reference voltage Vref_N or a precharge voltage Vpre_N in a general operational mode and a level of a reference voltage or a precharge voltage applied to a read condition in a read retry mode may be differently set. Referring to FIG. 18A, a level of a reference voltage Vref_1 or a precharge voltage Vpre_1 corresponding to the first read condition is lower than the level of the reference voltage Vref_N or the precharge voltage Vpre_N in a general operational mode, and a level of a reference voltage Vref_2 or a precharge voltage Vpre_2 corresponding to the second read condition is higher than the level of the reference voltage Vref_N or the precharge voltage Vpre_N in a general operational mode.

As illustrated in FIG. 18B, a level of a reference current Iref_1 corresponding to the first read condition is lower than a reference current Iref_N in a general operational mode, and a level of a reference current Iref_2 corresponding to the second read condition is higher than the reference current Iref_N in a general operational mode.

Figure 19:
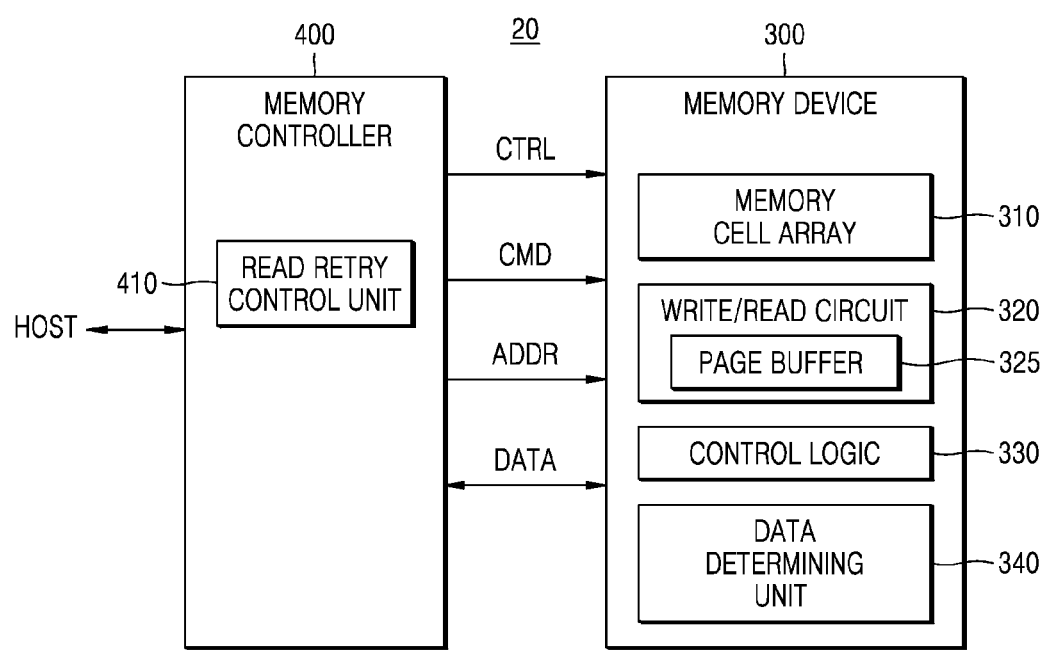
FIGS. 19 and 20 are respective block diagrams illustrating various memory systems according to embodiments of the inventive concept.

FIG. 19 is a block diagram illustrating a memory system 20 according to another embodiment of the inventive concept.

Referring to FIG. 19, the memory system 20 includes a memory device 300 and a memory controller 400, where the memory device 300 includes a memory cell array 310, a write/read circuit 320, a control logic 330, and a data determining unit 340 and the memory controller 400 includes a read retry control unit 410.

The memory cell array 310, write/read circuit 320, control logic 330 and read retry control unit 410 of FIG. 19 respectively correspond to the memory cell array 110, write/read circuit 120, control logic 130, and read retry control unit 210 of FIG. 1.

According to the embodiment illustrated in FIG. 19, a data determining operation with respect to read data in a read retry mode may be performed using the memory device 300. For example, if an uncorrectable error is generated in the read data returned by a normal read operation, the memory device 300 may enter a read retry mode under the control of the read retry control unit 410. In the read retry mode, as described above, a plurality of cell regions associated with a page of data may respectively be read according to different read conditions, and the data determining unit 340 may perform a determination operation to analyze a resistance level distribution with respect to the read data and to predict a valley. A determination result may be provided to the memory controller 400, and the memory controller 400 may control overall operation in the read retry mode based on the determination result.

Figure 20:
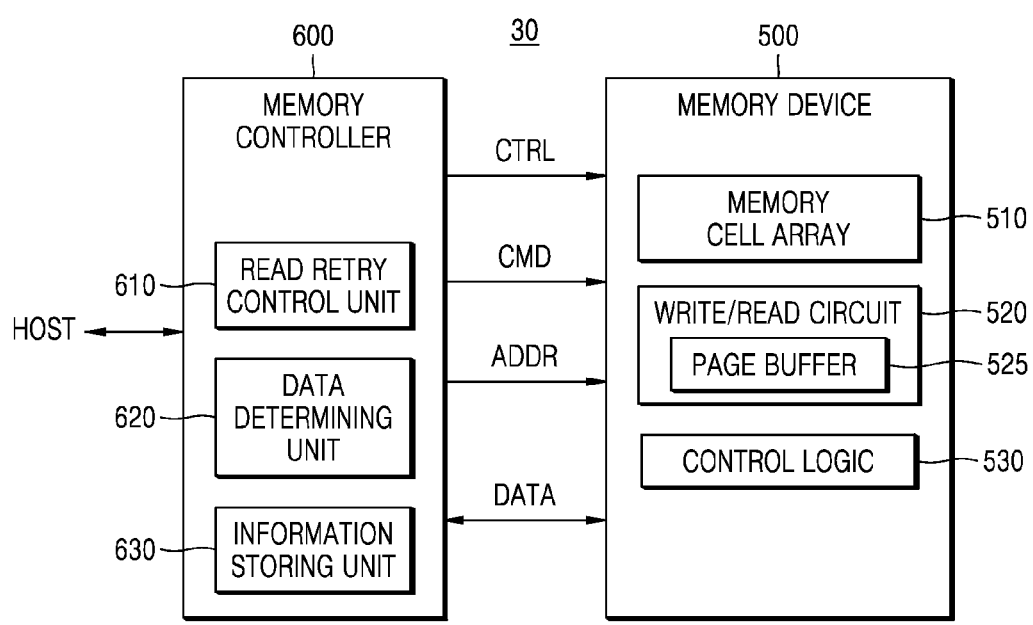

FIG. 20 is a block diagram illustrating a memory system 30 according to another embodiment of the inventive concept.

Referring to FIG. 20, the memory system 30 includes a memory device 500 and a memory controller 600, where the memory device 500 includes a memory cell array 510, a write/read circuit 520, and a control logic 530 and the memory controller 600 includes a read retry control unit 610, a data determining unit 620, and an information storing unit 630. While the data determining unit 620 is included in the memory controller 600 in FIG. 20, like the embodiment of FIG. 19 described above, the data determining unit 620 may be included in the memory device 500.

The memory cell array 510, write/read circuit 520, control logic 530, read retry control unit 610, and data determining unit 620 according to the embodiment illustrated in FIG. 20 respectively correspond to the memory cell array 110, write/read circuit 120, control logic 130, read retry control unit 210, and data determining unit 220 of FIG. 1.

Consistent with the above-described embodiments, the read retry control unit 610 may be used to control overall operations during the read retry mode, and read data with respect to a plurality of cell regions sensed using different read references may have various determinations made by the data determining unit 610. A valley in a particular resistance state distribution for memory cells of a page requested by a read request may be predicted based on the various determination result(s), And also, a read reference corresponding to the valley of the resistance level distribution may be selected.

The memory cell array 510 includes a plurality of pages, and different read references may be selected for the plurality of pages. For example, a resistance level distribution may be varied for each page of the memory cell array 510, and thus, read references corresponding to valleys of the resistance level distribution of respective pages may be different. The information storing unit 630 may store information related to the read references corresponding to respective pages. Next, the memory controller 600 refers to information related to a read reference stored in the information storing unit 630 during a normal read operation on the memory cell array 510, and read reference information corresponding to a page to be read may be provided to the memory device 500.

Figure 21:
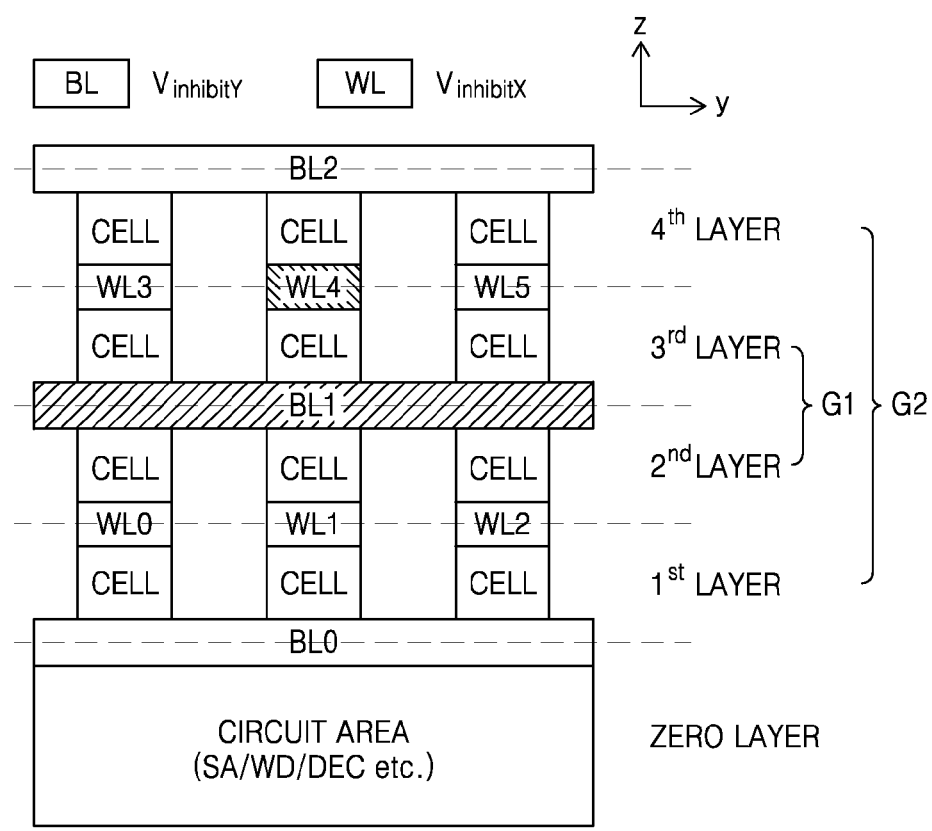
FIG. 21 is a cross-sectional diagram further illustrating in one example a memory device according to an embodiment of the inventive concept.

FIG. 21 illustrates a memory device that may be used in certain embodiments of the inventive concept.

Referring to FIG. 21, the memory device is a three-dimensional (3D) cross-point memory. In the illustrated example, bit line BL1 is assumed as a selected bit line and word line WL4 is assumed as a selected word line. Accordingly, a write, read or erase operation may be performed on a memory cell disposed in a region where the selected bit line BL1 and the selected word line WL4 cross each other, and an operational voltage or an operational current may be applied to the selected bit line B11 and the selected word line WL4. A first inhibit voltage $V_{inhibitY}$ may be applied to non-selected bit lines BL0 and BL1, and a second inhibit voltage $V_{inhibitX}$ may be applied to non-selected word lines WL0, WL1, LW2, WL3, and WL5.

Memory cells disposed in a second layer and a third layer adjacent to the selected bit line BL1, to which an operational voltage or an operational current is applied, may be determined as a first cell region G1, and memory cells disposed in a first layer and a fourth layer may be determined as a second cell region G2. Accordingly, a read retry operation may be independently performed according to first and second read references REF1 and REF2 respectively corresponding to the first and second cell regions G1 and G2.

Figure 22:
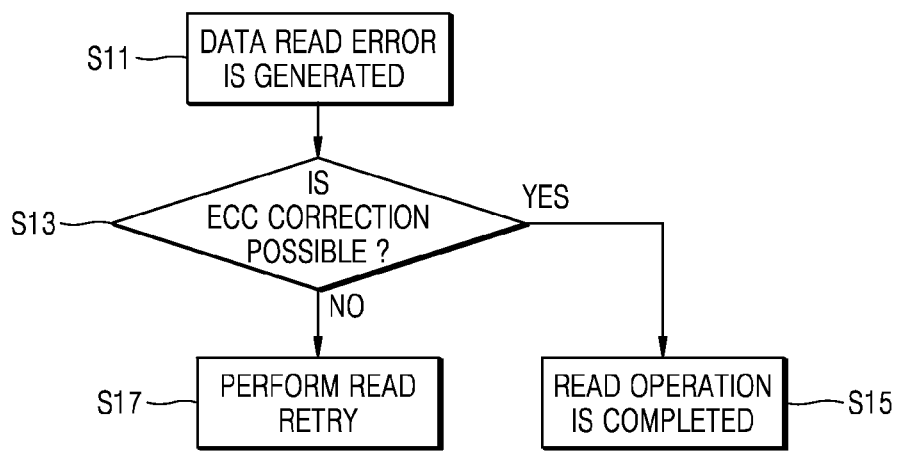
FIGS. 22, 23, 24, 25 and 26 are respective flowcharts or flowchart portions variously illustrating methods of operating a memory system according to embodiments of the inventive concept.

FIG. 22 is a flowchart summarizing a method of operating a memory system according to certain embodiments of the inventive concept.

Referring to FIG. 22, a series of operations performed by the memory system after a normal read operation is performed on the memory device are illustrated. A data read error is generated (S11), and then a determination is made as to whether the data read error is capable of being corrected using a given ECC capability (S13). As a result of determination, if ECC correction is possible, then the read operation is deemed completed (S15). Otherwise, if ECC correction is not possible a read retry operation is performed (S17).

Figure 23:
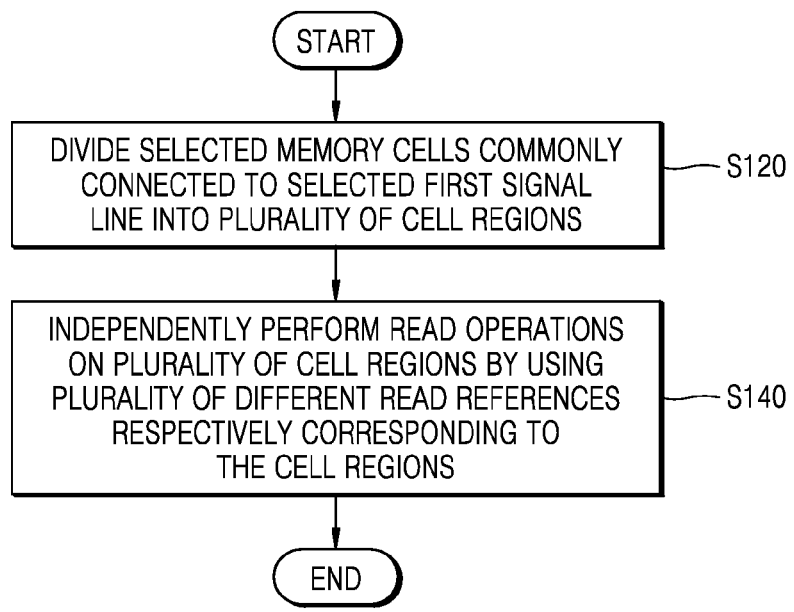

FIG. 23 is a flowchart further summarizing method steps that may be included in the read retry operation (S17) of FIG. 22.

Referring to FIG. 23, during the execution of the read retry operation, selected memory cells commonly connected to a selected first signal line are divided according to a plurality of cell regions (S120). That is, selected memory cells may be divided into a plurality of cell regions according to corresponding ECC units. For example, the first signal line may be a word line. According to an embodiment, selected memory cells may be divided into a plurality of cell regions according to a physical address. According to another embodiment, selected memory cells may be divided into a plurality of cell regions according to a logical address.

Then, read operations may be independently performed on a plurality of cell regions by using a plurality of different read references respectively corresponding to the plurality of cell regions (S140). The plurality of read references may be differently determined with respect to respective second signal lines respectively connected to the plurality of cell regions. For example, the second signal line may be a bit line.

According to some embodiments, in an operation of performing read operations with on a plurality of cell regions, read operations may be simultaneously performed on a plurality of cell regions by using a plurality of read references. According to other embodiments, in an operation of performing read operations on a plurality of cell regions, read operations may be sequentially performed on a plurality of cell regions by using a plurality of read references.

The method of FIG. 23 may further include an operation of setting a plurality of different read conditions according to a plurality of read references. The plurality of read conditions may include at least one of a voltage, a current, and a control signal applied to a read circuit connected to second signal lines respectively connected to a plurality of cell regions. The voltage may include at least one of a precharge voltage, a clamping voltage, a read voltage, and a reference voltage. The current may include a reference voltage. The control signal may include at least one of a precharge enable signal and a sense amp enable signal.

Before independently performing read operations (S140), the method may further include an operation of performing a normal read operation on selected memory cells by using one read reference. The operation of independently performing read operations (S140) may be a read retry operation that is performed when the number of errors as a result of performing the normal read operation exceeds a critical value.

Figure 24:
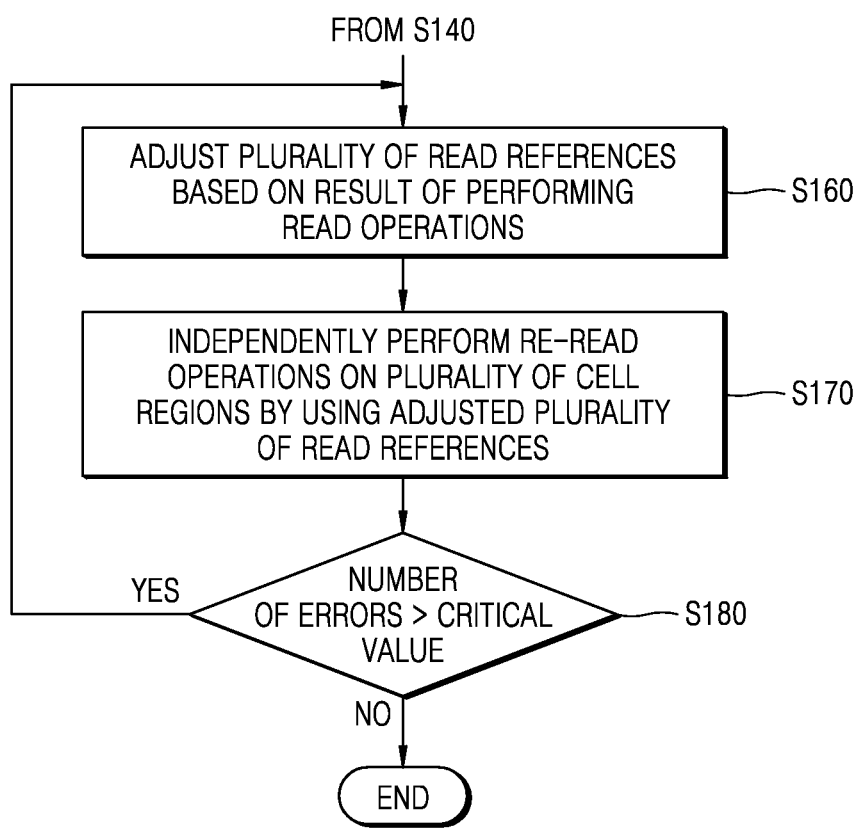

FIG. 24 is a flowchart summarizing further operations that may be included in the method described in relation to FIG. 23.

Referring to FIG. 24, a plurality of read references are adjusted based on a result of performing read operations (S160).

By using the adjusted plurality of read references, a read retry operation is independently performed on each of a plurality of cell regions (S170).

Then, a determination is made as to whether the number of errors exceeds a critical value (S180). As a result of determination, if the number of errors exceeds a critical value, operation S160 is performed again. If the number of errors does not exceed a critical value, the operation is ended.

Figure 25:
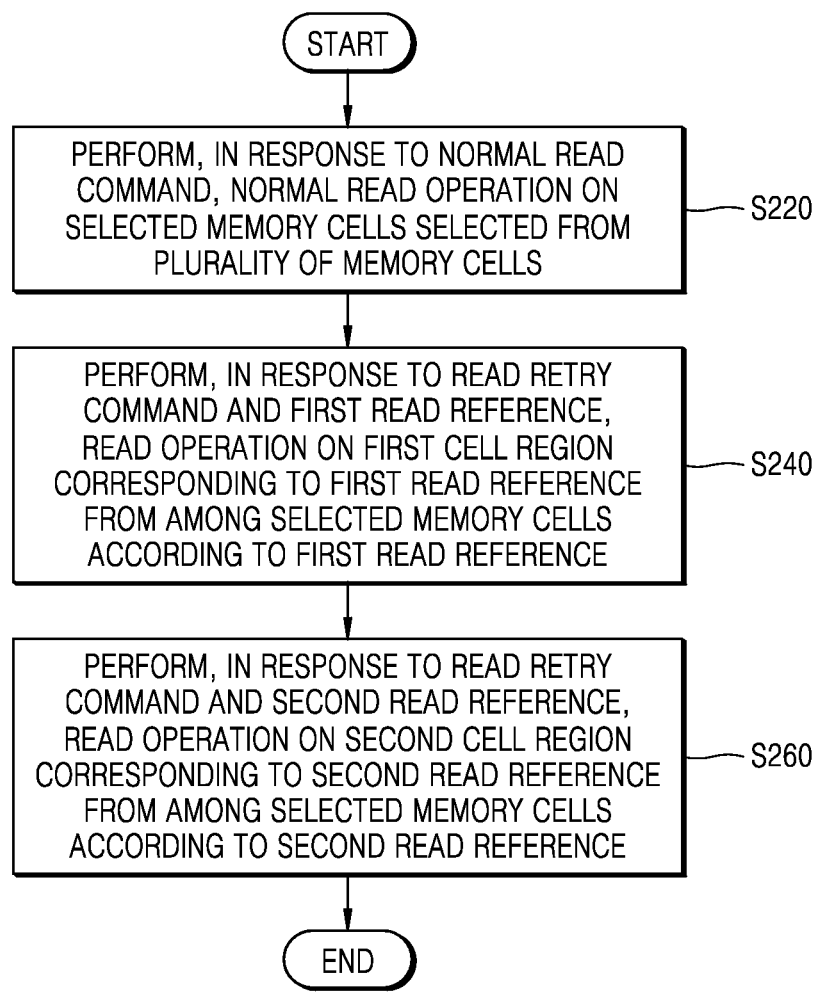

FIG. 25 is a flowchart summarizing a method of operating a memory device according to another embodiment of the inventive concept.

Referring to FIG. 25, the method of operating a memory device according to the present embodiment is a method of performing a read operation on selected memory cells included in a memory cell array included in the memory device, and may include operations that are performed in the memory device. Thus, description with reference to FIGS. 1 through 24 is also applied to the method of operating a memory device according to the present embodiment. Hereinafter, a method of operating a memory device according to the present embodiment will be described with reference to FIGS. 1 through 25.

In response to a normal read command, a normal read operation on selected memory cells is performed (S220).

Then, in response to a read retry command and a first read reference, a read operation is performed on a first cell region corresponding to the first read reference, from among selected memory cells (S240). And in response to a read retry command and a second read reference, a read operation is performed on a second cell region corresponding to the second read reference, from among selected memory cells (S260). Operations S240 and operation S260 may be simultaneously performed, sequentially performed, or reversed in performance order.

The method may further include an operation of setting a first read condition including at least one of a voltage, a current, and a control signal applied to first read circuits connected to the first cell region according to the first read reference and an operation of setting a second read condition including at least one of a voltage, a current, and a control signal applied to second read circuits connected to the second cell region according to the second read reference. The first and second read references may be different from each other.

Figure 26:
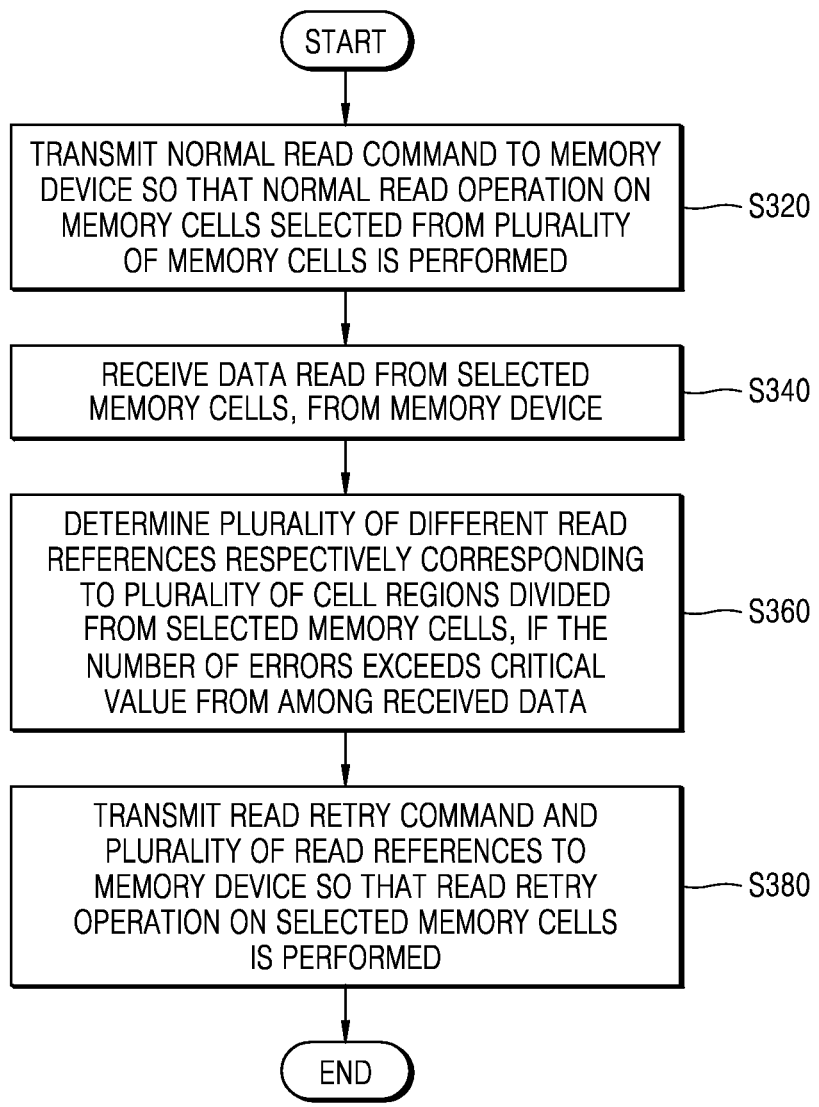

FIG. 26 is a flowchart summarizing a method of operating a memory system according to another embodiment of the inventive concept.

Referring to FIG. 25, the method of operating a memory device according to the present embodiment is a method of performing a read operation on selected memory cells included in a memory cell array included in the memory device, and may include operations that are performed in the memory device. Thus, description with reference to FIGS. 1 through 25 is also applied to the method of operating a memory device according to the present embodiment. Hereinafter, a method of operating a memory device according to the present embodiment will be described with reference to FIGS. 1 through 26.

Here, a normal read command is transmitted to the memory device so that a normal read operation with respect to selected memory cells is performed (S320). According to an embodiment, the selected memory cells may be commonly connected to the same first signal line. For example, the first signal line may be a word line.

Data read from the selected memory cells is received from the memory device (S340).

If the number of errors of data exceeds a critical value, a plurality of different read references respectively corresponding to a plurality of cell regions divided from the selected memory cells are determined (S360).

A read retry command and a plurality of read references are transmitted to the memory device so that a read retry operation is performed on the selected memory cells (S380).

According to another embodiment, the method may further include an operation of receiving data read according to the plurality of read references from the memory device and an operation of analyzing the read data to adjust the plurality of read references.

Figure 27A:
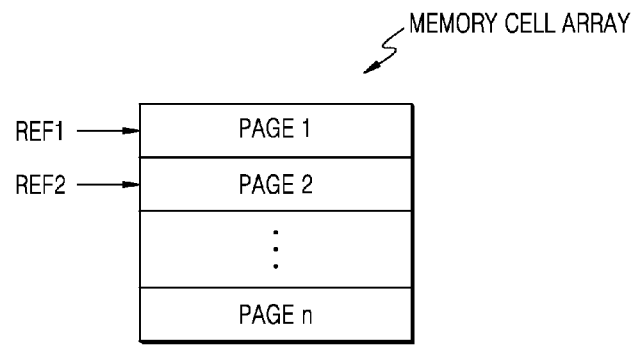
FIGS. 27A, 27B and 27C are respective block diagrams illustrating application examples according to embodiments of the inventive concept.
Figure 27B:
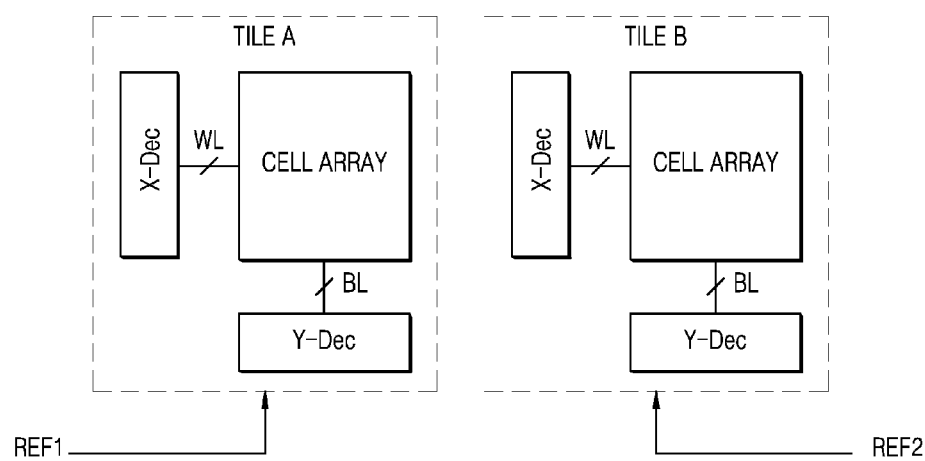
Figure 27C:
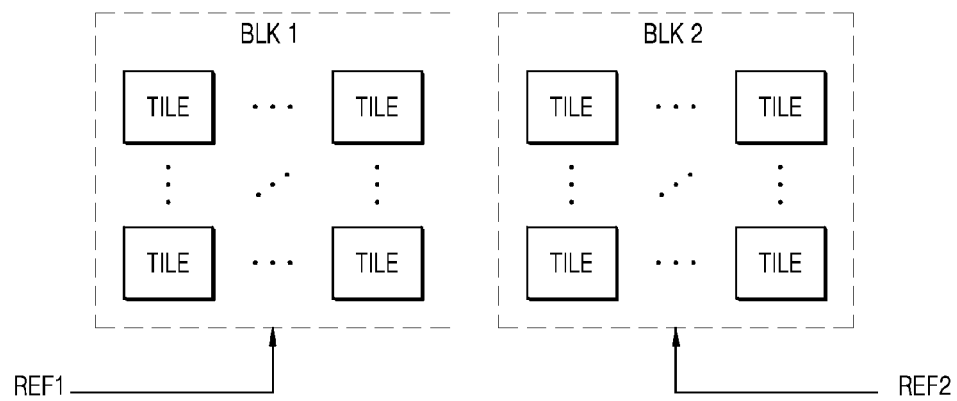

FIGS. 27A, 17B and 27C are block diagrams illustrating application examples according to embodiments of the inventive concept. That is, FIGS. 27A, 27B and 27C are block diagrams illustrating examples of storing information according to various regions of memory cells of the above embodiments. In FIGS. 27A, 27B and 27C, embodiments are illustrated, in which data is read from each of cell regions of a page in a read retry mode according to different read conditions, and a read condition under which the number of errors may be minimized is selected based on the read data, and read reference information related to the selected read condition is stored in the memory controller. When storing read reference information, memory cells may be defined as various regions.

Referring to FIG. 27A, a memory cell array includes multiple pages PAGE 1 through PAGE n, and different read conditions may be respectively set for the pages PAGE 1 through PAGE n. For example, a first read condition REF1 may be set for a first page PAGE 1, and a second read condition REF2 may be set for a second page PAGE 2. Read reference information used to set a read condition for each page as described above is stored in the memory controller, and data may be read from each page according to the read reference information in a normal read operation based on different read conditions.

Referring to FIG. 27B, a memory cell array may be defined according to tiles. For example, a tile may include a plurality of memory cells and word lines and bit lines connected to the plurality of memory cells. Also, a tile may include a row decoder that is commonly connected to the word lines and a column decoder that is commonly connected to the bit lines. In the present embodiment, a tile TILE A and a tile TILE B are illustrated.

Referring to the tile TILE A, the tile TILE A may include a plurality of pages according to the above-described embodiment, and data may be read from a plurality of cell regions included in each page in a read retry mode by using different read conditions. Also, a resistance level distribution of memory cells may be analyzed by using a data determining operation, and a valley of the resistance level distribution may be predicted. A reference condition REF1 whereby error generation may be commonly minimized with respect to a plurality of pages of the tile TILE A may be selected and stored, and subsequently, data may be read in a normal read operation based on the reference condition REF1. Similarly, a reference condition REF2 may be selected and stored with respect to the tile TILE B, and in a subsequent normal read operation, data may be read based on the reference condition REF2. The present embodiment may be advantageous if resistance level distributions are similarly changed for respective tiles.

Referring to FIG. 27C, a memory cell array may be defined according to blocks, and a block may include a plurality of tiles. In FIG. 33A, a first block BLK1 and a second block BLK2 are illustrated, and the first block BLK1 and the second block BLK2 may each include a plurality of tiles.

Referring to the first block BLK1, data may be read from a plurality of cell regions included in each page of a tile in a read retry mode by using different read conditions. A reference condition REF1 whereby error generation may be commonly minimized with respect to a plurality of tiles of the first block BLK 1 may be selected and stored, and in a subsequent normal read operation, data of the first block BLK1 may be read based on the reference condition REF1. Similarly, a reference condition REF2 may be selected and stored with respect to the second block BLK2, and data of the second block BLK2 may be read based on the reference condition REF2 in a subsequent normal read operation. The present embodiment may be advantageous if resistance level distributions are similarly changed for respective cell regions.

While ECC correctable errors may be generated by a read operation by using the reference conditions REF1 and REF2 in most cases as described with reference to FIGS. 27A through 27C, in some pages, uncorrectable errors may be generated. In this case, a read retry mode may be performed on corresponding pages, and time needed for the read retry mode may be reduced according to the method of the embodiments of the inventive concept. Also, as read reference information is previously stored based on a result of predicting a valley of a resistance level distribution, the number of times of entering a read retry mode may be reduced.

Figure 28:
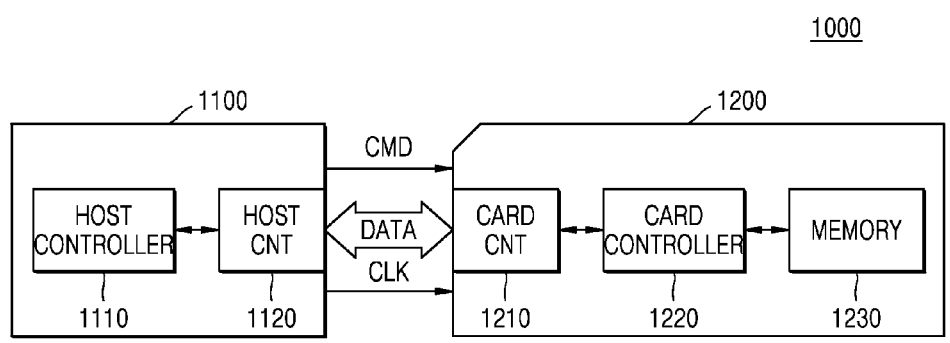
FIG. 28 is a block diagram illustrating a memory system according to embodiments of the inventive concept applied to a memory card system.

FIG. 28 is a block diagram illustrating a memory system according to the embodiments of the inventive concept, applied to a memory card system 1000.

Referring to FIG. 28, the memory card system 1000 may include a host 1100 and a memory card 1200. The host 1100 may include a host controller 1110 and a host contact 1120. The memory card 1200 may include a card contact 1210, a card controller 1220, and a memory device 1230. The memory card 1200 may be implemented by using the embodiments illustrated in FIGS. 1 through 27.

The host 1100 may write data to the memory card 1200 or read data stored in the memory card 1200. The host controller 1110 may transmit a command CMD, a clock signal CLK generated in a clock generator (not shown) in the host 1100, and data DATA to the memory card 1200 through the host contact 1120.

In response to the command CMD received by using the card contact 1210, the card controller 1220 may store data in the memory device 1230 in synchronization with a clock signal generated by a clock generator (not shown) in the card controller 1220. The memory device 1230 may store data transmitted from the host 1100.

The memory card 1200 may be a compact flash card (CFC), a Microdrive, a smart media card (SMC), a multimedia card (MMC), a security digital card (SDC), a memory stick, or a universal serial bus (USB) flash memory driver.

Figure 29:
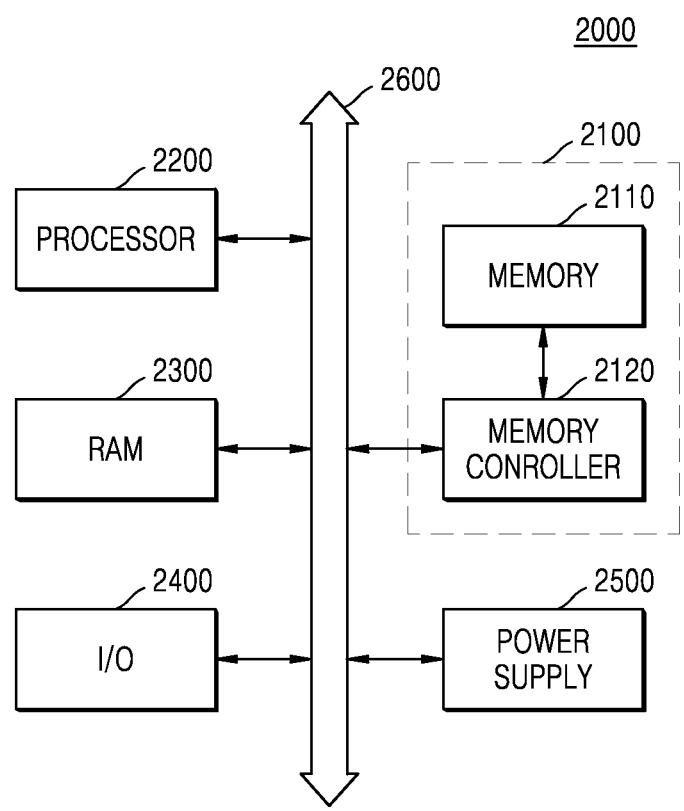
FIG. 29 is a block diagram illustrating a computing system including a memory system according to embodiments of the inventive concept.

FIG. 29 is a block diagram illustrating a computing system 2000 including a memory system according to embodiments of the inventive concept.

Referring to FIG. 29, the computing system 2000 may include a memory system 2100, a processor 2200, a RAM 2300, an input/output device 2400, and a power device 2500. Meanwhile, although not illustrated in FIG. 29, the computing system 2000 may further include ports via which to communicate with a video card, a sound card, a memory card, or a USB device, or other electronic appliances. The computing system 2000 may be a personal computer or a portable electronic device such as a laptop computer, a mobile phone, a personal digital assistant (PDA) or a camera.

The processor 2200 may perform particular computations or tasks. According to an embodiment, the processor 2200 may be a micro-processor or a central processing unit (CPU). The processor 2200 may perform communication with the RAM 2300, the input/output device 2400, and the memory system 2100 via a bus 2600 such as an address bus, a control bus, or a data bus. The memory system 2100 may be implemented by using the embodiments illustrated in FIGS. 1 through 28.

According to an embodiment, the processor 2200 may also be connected to an extension bus such as a peripheral component interconnect (PCI) bus.

The RAM 2300 may store data needed in operating the computing system 2000. For example, the RAM 2300 may be a DRAM, a mobile DRAM, an SRAM, a PRAM, an FRAM, an RRAM, and/or an MRAM.

The input/output device 2400 may include an input unit such as a keyboard, a keypad, or a mouse and an output unit such as a printer or a display. The power device 2500 may supply an operating voltage needed in operating the computing system 2000.

Figure 30:
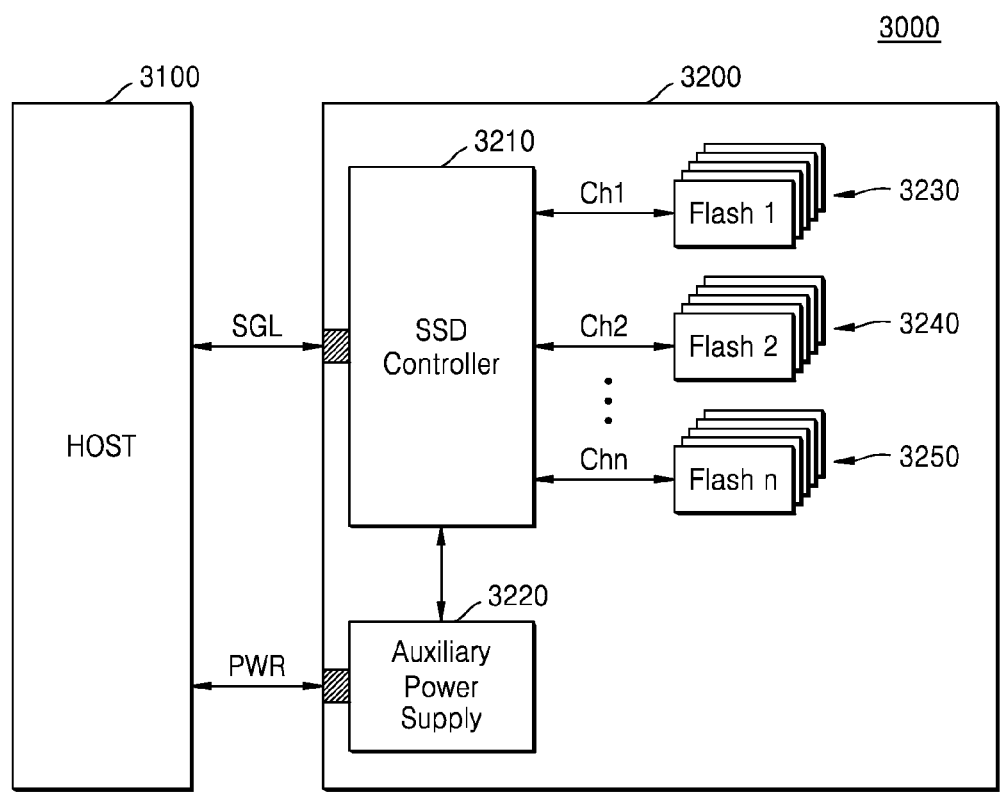
FIG. 30 is a block diagram illustrating a memory system according to embodiments of the inventive concept applied to a solid state disk (SSD) system.

FIG. 30 is a block diagram illustrating a memory system according to embodiments of the inventive concept, applied to a solid state disk (SSD) system 3000.

Referring to FIG. 30, the SSD system 3000 may include a host 3100 and an SSD 3200. The SSD 3200 may transmit or receive a signal to and from the host 3100 via a signal connector, and may receive power via a power connector. The SSD 3200 may include an SSD controller 3210, an auxiliary power device 3220, and a plurality of memory devices 3230, 3240, and 3250. The SSD 3200 may be implemented by using the embodiments illustrated in FIGS. 1 through 29.

While the inventive concept has been particularly shown and described with reference to exemplary embodiments thereof, it will be understood that various changes in form and details may be made therein without departing from the scope of the following claims.

What is claimed is:

1. A method of operating a memory system including memory cells commonly connected to a first signal line in a memory cell array, the method comprising:
    dividing the memory cells according to cell regions;
    independently performing read operations on memory cells disposed in each cell region using a read reference selected from a plurality of read references and respectively corresponding to each cell region;
    adjusting the plurality of read references based on read data from the cell regions;
    independently performing a read retry operation on memory cells of each cell region by using one of the adjusted plurality of read references; and
    determining whether a number of errors in read data returned by the read retry operations exceeds a critical value.

2. The method of claim 1, further comprising:
    before the independently performing the read operations, performing a normal read operation on the memory cells by a normal read reference,
    wherein independently performing the read operations is part of a read retry operation performed in relation to the memory cells following the normal read operation.

3. The method of claim 2, further comprising:
    determining a number of errors in read data returned by the normal read operation,
    wherein the read retry operation is performed only when the number of errors in the read data exceed a critical value.

4. The method of claim 1, further comprising:
    storing read data returned by each of the independently performed read operations in a page buffer connected to the memory cells,
    wherein a number of the memory cells disposed in each of the cell regions is less than a size of the page buffer.

5. The method of claim 1, wherein each one of the plurality of read references is differently determined with respect to respective second signal lines in the cell regions and crossing the first signal line.

6. The method of claim 5, further comprising:
setting a different read condition according to each one of the plurality of read references,
wherein the setting of each read condition includes defining at least one of a voltage, a current, and a control signal applied to a read circuit connected to the second signal lines.

7. The method of claim 6, wherein the voltage comprises at least one of a read voltage, a precharge voltage, a clamping voltage, and a reference voltage,
the current comprises a reference current, and
the control signal comprises at least one of a precharge enable signal and a sense amp enable signal.

8. The method of claim 1, wherein the independently performing read operations includes simultaneously performing at least two read operations directed to memory cells disposed in at least two of the cell regions.

9. The method of claim 1, wherein the independently performing read operations includes sequentially performing at least two read operations directed to memory cells disposed in at least two of the cell regions.

10. The method of claim 1, wherein the first signal line is a word line, and the second signal lines are bit lines.

11. The method of claim 1, wherein dividing the memory cells according to cell regions is performed according to error correction code (ECC) units.

12. The method of claim 1, wherein dividing the memory cells according to cell regions comprises dividing the memory cells according to a physical address or a logical address.

13. A method of operating a memory system comprising a memory device including a plurality of memory cells disposed in a plurality of cell regions disposed in areas where first signal lines and second signal lines respectively cross in a memory cell array, and a memory controller, the method comprising:
communicating a normal read command from the memory controller to the memory device directed to target memory cells selected from the plurality of memory cells;
executing a normal read operation with respect to the target memory cells and storing normal read result data in a page buffer connected to the second signal lines;
determining different read references respectively corresponding to each one of the plurality of cell regions;
if a number of errors in the normal read result exceeds a critical value, communicating a read retry command together with information defining the different read references to the memory device and performing a read retry operation on the target memory cells; and
adjusting the plurality of read references by analyzing the retry read result data.

14. The method of claim 13, wherein the target memory cells are commonly connected to the same first signal line, and
the determining of the different read references comprises respectively determining a read reference for each one of the second signal lines.

15. The method of claim 13, further comprising:
executing a read retry operation with respect to the target memory cells;
storing retry read result data in the page buffer in response to the read retry operation,
wherein the read retry operation comprises a plurality of read operations respectively directed to memory cells disposed in each one of the cell regions, and each one of the plurality of read operations is performed using one of the different read references.

16. A memory device comprising:
a memory cell array including a plurality of memory cells disposed in areas where a plurality of first signal lines and a plurality of second signal lines cross each other;
a write/read circuit configured to perform a write operation and a read operation on memory cells selected from the plurality of memory cells and including a page buffer that temporarily stores read data;
a control logic configured to control a read operation on the selected memory cells by using a plurality of different read references respectively corresponding to a plurality of cell regions divided from the selected memory cells in a read retry section; and
adjusting the plurality of read references by analyzing the retry read result data.

17. The memory device of claim 16, wherein the selected memory cells are commonly connected to the same first signal line, and
the plurality of read references are different for respective second signal lines respectively connected to the plurality of cell regions.

* * * * *